US012677578B2

(12) United States Patent
Mitobe et al.

(10) Patent No.: US 12,677,578 B2
(45) Date of Patent: Jul. 7, 2026

(54) ORGANIC EL DISPLAY DEVICE

(71) Applicant: FUJIFILM Corporation, Tokyo (JP)

(72) Inventors: Fumitake Mitobe, Kanagawa (JP); Keigo Shiga, Kanagawa (JP); Eiichiro Aminaka, Kanagawa (JP); Shinichi Yoshinari, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 18/653,566

(22) Filed: May 2, 2024

(65) Prior Publication Data

US 2024/0324428 A1     Sep. 26, 2024

Related U.S. Application Data

(63) Continuation of application No. PCT/JP2022/041514, filed on Nov. 8, 2022.

(30) Foreign Application Priority Data

Nov. 9, 2021    (JP) ................................. 2021-182514
Nov. 7, 2022    (JP) ................................. 2022-177929

(51) Int. Cl.
*G02B 5/30*       (2006.01)
*H10K 59/80*     (2023.01)

(52) U.S. Cl.
CPC ....... *H10K 59/8792* (2023.02); *G02B 5/3016* (2013.01)

(58) Field of Classification Search
CPC ............. G02B 5/3016; G02F 1/133634; G02F 2413/11
See application file for complete search history.

(56) References Cited

U.S. PATENT DOCUMENTS

| | | | |
|---|---|---|---|
| 2010/0053509 | A1 | 3/2010 | Saitoh et al. |
| 2020/0319507 | A1 | 10/2020 | Matsuyama et al. |
| 2021/0403811 | A1 | 12/2021 | Kasai et al. |

FOREIGN PATENT DOCUMENTS

| | | |
|---|---|---|
| JP | 2010-079288 A | 4/2010 |
| JP | 2010-122670 A | 6/2010 |

(Continued)

OTHER PUBLICATIONS

JP 2018022153 A machine translation (Ishiguro Makoto et al.) (Year: 2018).*

(Continued)

*Primary Examiner* — James A Dudek
(74) *Attorney, Agent, or Firm* — Edwards Neils LLC; Jean C. Edwards, Esq.

(57) ABSTRACT

An organic EL display device capable of suppressing a change in tint in a case where white display is visually recognized from an oblique direction. The organic EL display device includes an organic EL display element and a light absorption anisotropic layer, in which the light absorption anisotropic layer is a light absorption anisotropic layer formed of a composition containing a liquid crystal compound and a dichroic substance, an angle between a transmittance central axis of the light absorption anisotropic layer and a normal line of a layer plane of the light absorption anisotropic layer is 0° or more and 450 or less, and $A(\lambda)$ of the light absorption anisotropic layer represented by Expression (1) $A(\lambda)=\{kz(\lambda)-(kx(\lambda)+ky(\lambda))/2\}\times d$, is 15 to 225 nm at a maximal absorption wavelength of the light absorption anisotropic layer.

18 Claims, 1 Drawing Sheet

(56)        References Cited

FOREIGN PATENT DOCUMENTS

| | | | |
|----|-------------|----|---------|
| JP | 2011-257479 | A  | 12/2011 |
| JP | 2018-022153 | A  | 2/2018  |
| WO | 2019/132020 | A1 | 7/2019  |
| WO | 2020/095831 | A1 | 5/2020  |

OTHER PUBLICATIONS

WO 2020095831 A1 machine translation (Kasai, Tatsuaki et al. (Year: 2020).*
Office Action which was issued by the Korean Intellectual Property Office on Jan. 7, 2025, in connection with Korean Patent Application No. 10-2024-7013241.
International Search Report issued in PCT/JP2022/041514 on Jan. 24, 2023.
Written Opinion issued in PCT/JP2022/041514 on Jan. 24, 2023.
International Preliminary Report on Patentability completed by WIPO on May 2, 2024 in connection with International Patent Application No. PCT/JP2022/041514.

\* cited by examiner

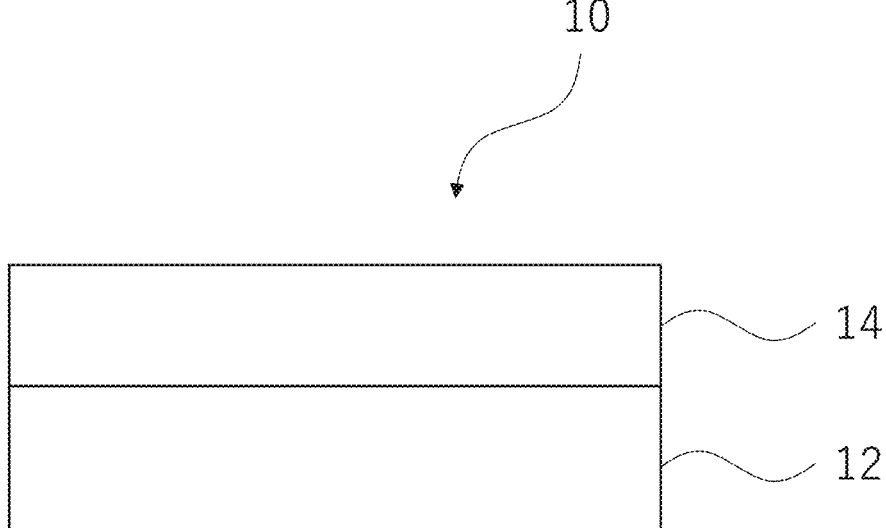

ORGANIC EL DISPLAY DEVICE

CROSS-REFERENCE TO RELATED APPLICATIONS

This application is a Continuation of PCT International Application No. PCT/JP2022/041514 filed on Nov. 8, 2022, which was published under PCT Article 21(2) in Japanese, and which claims priority under 35 U.S.C. § 119(a) to Japanese Patent Application No. 2021-182514 filed on Nov. 9, 2021 and Japanese Patent Application No. 2022-177929 filed on Nov. 7, 2022. The above applications are hereby expressly incorporated by reference, in their entirety, into the present application.

BACKGROUND OF THE INVENTION

1. Field of the Invention

The present invention relates to an organic EL display device.

2. Description of the Related Art

In recent years, self light emitting display elements typified by organic electroluminescent elements (organic EL elements) have been attracting attention as a display element constituting a flat screen display device.

Among these, a self light emitting display element having a microcavity structure has excellent brightness and color purity. The microcavity structure is a structure in which an optical path length between upper and lower electrodes (that is, anode electrode and cathode electrode) of an organic material is matched to a peak wavelength of the spectrum of the light to be extracted, whereby only the light of a predetermined wavelength is resonated and the light of other wavelengths is weakened.

On the other hand, a circularly polarizing plate has been used in an organic EL display device in order to suppress an adverse effect due to reflection of external light in the related art. For example, WO2020/095831A discloses that a circularly polarizing plate (elliptically polarizing plate) obtained by applying a vertical alignment liquid crystal cured film and a horizontal alignment retardation film is applied to an organic EL display device.

SUMMARY OF THE INVENTION

However, in a case where the present inventors have studied an organic EL display device using a polarizing plate of the related art (for example, a circularly polarizing plate described in WO2020/095831A), it has been found that, in a case of using the polarizing plate of the related art, although the adverse effect due to the external light reflection in a case of being visually recognized from an oblique direction is suppressed, there is a problem that a tint is changed in a case where white display is visually recognized from the oblique direction as compared with a case where white display is visually recognized from the front direction.

Therefore, an object of the present invention is to provide an organic EL display device capable of suppressing a change in tint in a case where white display is visually recognized from an oblique direction.

As a result of intensive studies, the present inventors have found that, by using a light absorption anisotropic layer in which an angle between a transmittance central axis and a normal line of a layer plane is 0° or more and 450 or less and absorption anisotropy in a thickness direction is controlled, it is possible to improve the change in tint in a case where white display is visually recognized from an oblique direction.

That is, the inventors have found that the object can be achieved with the following configuration.

[1] An organic EL display device comprising an organic EL display element and a light absorption anisotropic layer, in which the light absorption anisotropic layer is a light absorption anisotropic layer formed of a composition containing a liquid crystal compound and a dichroic substance, an angle between a transmittance central axis of the light absorption anisotropic layer and a normal line of a layer plane of the light absorption anisotropic layer is 0° or more and 450 or less, and $A(\lambda)$ of the light absorption anisotropic layer represented by Expression (1) is 15 to 225 nm at a maximal absorption wavelength of the light absorption anisotropic layer.

[2] The organic EL display device according to [1], in which $B(\lambda)$ represented by Expression (2) is 30 or more at the maximal absorption wavelength of the light absorption anisotropic layer.

[3] The organic EL display device according to [1] or [2], further comprising a polarizer, in which the light absorption anisotropic layer is disposed on a visible side of the polarizer.

[4] The organic EL display device according to [3], further comprising a polarization control layer, in which the polarization control layer is disposed on the visible side of the polarizer.

[5] The organic EL display device according to [4], in which the polarization control layer is a $\lambda/4$ film, and a phase difference Rth in a thickness direction of the light absorption anisotropic layer is −200 to −20 nm at the maximal absorption wavelength of the light absorption anisotropic layer.

[6] The organic EL display device according to [4], in which the polarization control layer is a depolarization film.

[7] The organic EL display device according to any one of [1] to [6], in which the liquid crystal compound has a forward wavelength dispersion, and the composition contains a vertical alignment agent.

[8] The organic EL display device according to any one of [1] to [7], in which a ratio of a smallest value of $A(\lambda)$ of the light absorption anisotropic layer at a wavelength of 400 to 650 nm to a value of $A(\lambda)$ at the maximal absorption wavelength of the light absorption anisotropic layer is 0.35 or less.

[9] The organic EL display device according to any one of [1] to [8], in which, in a white display, the organic EL display element has $\Delta u'v'(60°)$ larger than 0.005, which is represented by Expression (3A), on a CIE 1976 u'v' chromaticity diagram, and in at least one layer of the light absorption anisotropic layers, the angle between the transmittance central axis of the light absorption anisotropic layer and the normal line of the layer plane of the light absorption anisotropic layer is 15° or more and 450 or less.

[10] The organic EL display device according to [9], further comprising a polarizer and a polarization control layer, in which the polarization control layer, the light absorption anisotropic layer, and the polarizer are laminated in this order from a visible side.

[11] The organic EL display device according to any one of [1] to [8], in which, in a white display, the organic the organic EL display element satisfies a relationship of u'(0°)>u'(30°)>u'(60°), and satisfies a relationship of v'(0°)>v'(30°) and v'(0°)>v'(60°), and the maximal absorption wavelength of the light absorption anisotropic layer is in a range of 460 to 500 nm.

Here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

[12] The organic EL display device according to any one of [1] to [8], in which, in a white display, the organic the organic EL display element satisfies a relationship of u'(0°)>u'(30°) and u'(0°)>u'(60°), and satisfies a relationship of v'(0°)>v'(30°) and v'(30°)<v'(60°), and the maximal absorption wavelength of the light absorption anisotropic layer is in a range of 510 to 570 nm.

Here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

According to the present invention, it is possible to provide an organic EL display device capable of suppressing a change in tint in a case where white display is visually recognized from an oblique direction.

BRIEF DESCRIPTION OF THE DRAWINGS

FIG. 1 is an example of a schematic cross-sectional view of the organic EL display device of the present invention.

DESCRIPTION OF THE PREFERRED EMBODIMENTS

Hereinafter, the present invention will be described in detail.

Although the configuration requirements to be described below may be described based on representative embodiments of the present invention, the present invention is not limited to such embodiments.

Any numerical range expressed using "to" in the present specification refers to a range including the numerical values before and after the "to" as a lower limit value and an upper limit value, respectively.

In addition, in the present specification, a term "parallel" or "orthogonal" does not indicate parallel or orthogonal in a strict sense, but indicates a range of ±5° from parallel or orthogonal.

In addition, in the present specification, the concepts of the liquid crystal composition and the liquid crystal compound also include those that no longer exhibit liquid crystallinity due to curing or the like.

Furthermore, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

In addition, in this specification, "(meth)acrylate" represents a notation of "acrylate" or "methacrylate", "(meth) acryl" represents a notation of "acryl" or "methacryl", and "(meth)acryloyl" represents a notation of "acryloyl" or "methacryloyl".

In the present invention, refractive indices nx and ny are refractive indices in the in-plane direction of an optical member, and typically, nx represents a refractive index of a slow axis azimuth and ny represents a refractive index of a fast axis azimuth (that is, the azimuth orthogonal to the slow axis). In addition, nz represents a refractive index in the thickness direction. nx, ny, and nz can be measured, for example, with an Abbe refractometer (NAR-4T, manufactured by Atago Co., Ltd.) using a sodium lamp (λ=589 nm) as a light source. In a case of measuring the wavelength dependence, a multi-wavelength Abbe refractometer DR-M2 (manufactured by Atago Co., Ltd.) can be used in combination with an interference filter. In addition, values from Polymer Handbook (John Wiley & Sons, Inc.) and catalogs of various optical films can also be used.

In the present specification, Re(λ) and Rth(λ) respectively represent an in-plane phase difference at a wavelength k and a phase difference at a wavelength k in a thickness direction, and refractive indices nx, ny, and nz are represented by Equation (7) and Equation (8) using a film thickness d(μ).

$$Re(\lambda) = (nx - ny) \times d \times 1000 \ (\text{nm}) \qquad \text{Equation (7)}$$

$$Rth(\lambda) = ((nx + ny)/2 - nz) \times d \times 1000 \ (\text{nm}) \qquad \text{Equation (8)}$$

The wavelength λ is set to 550 nm unless otherwise specified.

The slow axis azimuth, Re(λ), and Rth(λ) can be measured using, for example, AxoScan OPMF-1 (manufactured by Opto Science Inc.).

The organic EL display device according to the embodiment of the present invention includes an organic EL display element and a light absorption anisotropic layer. The above-described light absorption anisotropic layer is formed of a composition containing a liquid crystal compound and a dichroic substance.

Here, an angle between a transmittance central axis of the light absorption anisotropic layer and a normal line of a layer plane of the light absorption anisotropic layer is 0° or more and 450 or less, and A(λ) of the light absorption anisotropic layer, which is represented by Expression (1) described later, is 15 to 225 nm at a maximal absorption wavelength of the light absorption anisotropic layer.

In a case where the light absorption anisotropic layer as described above is used, the change in tint in a case where the white display is visually recognized from the oblique direction can be adjusted by the light absorption anisotropic layer. Therefore, it is considered that the change in a tint can be suppressed.

Hereinafter, the configuration of the organic EL display device according to the embodiment of the present invention will be described.

<Light Absorption Anisotropic Layer>

In the light absorption anisotropic layer used in the organic EL display device according to the embodiment of the present invention, an angle between a transmittance central axis of the light absorption anisotropic layer and a normal line of a layer plane of the light absorption anisotropic layer is 0° or more and 45° or less. Here, the transmittance central axis means an angle and a direction exhibiting the highest transmittance in a case where the transmittance is measured by changing the inclination angle and the inclination direction with respect to the film normal direction.

The angle between a transmittance central axis of the light absorption anisotropic layer and a normal line of a layer plane of the light absorption anisotropic layer can be adjusted according to the organic EL display element.

FIG. 1 shows a schematic cross-sectional view of the optical laminate according to the embodiment of the present invention. An organic EL display device 10 comprises an organic EL display element 12 and a light absorption aniso-tropic layer 14. The light absorption anisotropic layer 14 has the features described above.

In order to control the transmittance central axis of the light absorption anisotropic layer, an aspect of aligning a dichroic substance (preferably, the organic dichroic coloring agent) is preferable, and an aspect of aligning a dichroic substance (preferably, the organic dichroic coloring agent) using alignment of a liquid crystal compound is more preferable.

In addition, the light absorption anisotropic layer is formed of a composition containing a liquid crystal com-pound and a dichroic substance used in the organic EL display device according to the embodiment of the present invention.

Examples of such a light absorption anisotropic layer include a light absorption anisotropic layer in which at least one kind of organic dichroic coloring agent is aligned perpendicular to the in-plane.

As a technique for aligning an organic dichroic coloring agent as desired, a technique for preparing a polarizer formed of an organic dichroic coloring agent, a technique for preparing a guest-host liquid crystal cell, and the like can be referred to. For example, techniques used in the method of preparing a dichroic polarizer described in JP1999-305036A (JP-H11-305036A) or JP2002-90526A and the method of preparing a guest-host type liquid crystal display device described in JP2002-99388A or JP2016-27387A can be used for preparation of the light absorption anisotropic layer used in the present invention.

For example, molecules of the organic dichroic coloring agent can be desirably aligned as described above in asso-ciation with the alignment of host liquid crystals using the technique of the guest-host type liquid crystal cell. Specifi-cally, the light absorption anisotropic layer used in the present invention can be prepared by mixing an organic dichroic coloring agent serving as a guest and a rod-like liquid crystal compound serving as a host liquid crystal, aligning the host liquid crystal, aligning molecules of the organic dichroic coloring agent along the alignment of the liquid crystal molecules, and fixing the alignment state.

It is preferable that the alignment of the organic dichroic coloring agent is fixed by forming a chemical bond in order to prevent fluctuation of the light absorption characteristics of the light absorption anisotropic layer used in the present invention depending on the use environment. For example, the alignment can be fixed by advancing polymerization of the host liquid crystal, the organic dichroic coloring agent, or a polymerizable component added as desired.

In addition, the guest-host type liquid crystal cell having a liquid crystal layer that contains at least an organic dichroic coloring agent and a host liquid crystal on a pair of substrates may be used as the light absorption anisotropic layer used in the present invention. The alignment of the host liquid crystal (the alignment of the organic dichroic coloring agent molecules in association of the alignment of the host liquid crystal) is made such that the alignment state thereof is maintained as long as the alignment can be controlled by the alignment film formed on the inner surface of the substrate and an external stimulus such as an electric field is not applied, and the light absorption characteristics of the light absorption anisotropic layer used in the present inven-tion can be set to be constant.

In the present invention, the phase difference Rth of the light absorption anisotropic layer in the thickness direction at the maximal absorption wavelength of the light absorption anisotropic layer is preferably −200 to −20 nm, more pref-erably −150 to −20 nm, and still more preferably −20 to −60 nm. By controlling Rth in the above-described range, the phase difference in the thickness direction of the λ/4 retar-dation layer which may be provided in the organic EL display device according to the embodiment of the present invention can be compensated, and the reflectivity of light incident from an oblique direction.

In the present invention, the maximal absorption wave-length of the light absorption anisotropic layer is preferably in a wavelength range of 380 to 780 nm in the visible region.

In the present invention, the above-described light absorp-tion anisotropic layer is used. The degree of absorption anisotropy can be expressed by various parameters, and an example thereof is A(λ) defined by Expression (1).

$$A(\lambda) = \{kz(\lambda) - (kx(\lambda) + ky(\lambda))/2\} \times d \qquad \text{Expression (1)}$$

In the formula, d represents a thickness of the light absorption anisotropic layer, and a unit of the thickness of the light absorption anisotropic layer represented by d is nm. In addition, $kx(\lambda)$ and $ky(\lambda)$ are each an absorption coeffi-cient with respect to light having a wavelength λ in each of an x axis direction and a y axis direction orthogonal to each other in a plane of the light absorption anisotropic layer. $kz(\lambda)$ is a light absorption coefficient with respect to the light having the wavelength Xin a z axis direction orthogonal to the plane including the x axis and the y axis. Here, the absorption coefficient k is also referred to as an attenuation index, and is a value related to how much light energy is absorbed in the substance. In general, a real component n of the complex refractive index is a so-called refractive index, and an imaginary component k is an absorption coefficient. The k described in the present invention is a physical property value different from the so-called attenuation coef-ficient α. The attenuation index and the attenuation coeffi-cient is, for example, described in detail in pages 218 to 219 of 4. 11. 2 "Beam propagation in an absorbing medium" in "Principles of Optics, 7th (expanded) edition" by Max Born and Emil Wolf.

In the present invention, the value of A(λ) at the maximal absorption wavelength of the light absorption anisotropic layer described above is 15 to 225 nm, preferably 20 to 200 nm, and more preferably 20 to 100 nm. By controlling the value of A(λ) in this range, the change in tint in white display of the display can be suppressed.

In the present invention, the light absorption anisotropic layer may have a laminated structure of two or more layers. In the laminated structure, the values of A(λ) and Rth(λ) can be obtained by summing the values of A(λ) and Rth(λ) of each layer.

In addition, in a case where the two or more light absorption anisotropic layers are provided and the maximal absorption wavelengths of the light absorption anisotropic layers are different from each other, A(λ) is obtained by summing the values of the respective layers for each maxi-mal absorption wavelength, and at least one A(λ) of the obtained A(λ)'s at the maximal absorption wavelengths is in the above range. In a case where the two or more light absorption anisotropic layers are provided and the maximal absorption wavelengths of the light absorption anisotropic layers are different from each other, it is preferable that the A(λ) to be obtained is in the above-described range at all maximal absorption wavelength.

In the present invention, the above-described light absorption anisotropic layer is used. The degree of absorption anisotropy can be expressed by various parameters, and an example thereof is B(λ) defined by Expression (2).

$$B(\lambda) = kz(\lambda)/\{(kx(\lambda) + ky(\lambda))/2\}$$  Expression (2)

In the expression, kx(λ) and ky(λ) are each an attenuation index with respect to light having a wavelength λ in each of an x axis direction and a y axis direction orthogonal to each other in a plane of the light absorption anisotropic layer, and kz(λ) is an attenuation index with respect to the light having the wavelength kin a z axis direction orthogonal to the plane including the x axis and the y axis. The meanings of the parameters are the same as those in Formula (1) described above.

In the present invention, the value of B(λ) at the maximal absorption wavelength of the light absorption anisotropic layer described above is preferably 30 or more, more preferably 50 or more, and still more preferably 100 or more. By controlling the value of B(λ) in this range, it is possible to suppress the change in tint in white display while further suppressing the absorption of the light emitted from the display.

The upper limit of the value of B(λ) is not particularly limited, but is preferably 250 or less.

In the present invention, the light absorption anisotropic layer may have a laminated structure of two or more layers, and in the laminated structure, the value of B(λ) can be obtained by averaging the value of B(λ) in each layer with A(λ) in each layer. For example, in a case where the light absorption anisotropic layer consists of the light absorption anisotropic layer X1 and the light absorption anisotropic layer X2, the A(λ)'s at both maximal absorption wavelengths are denoted as A₁ and A₂, and the values of B(λ)'s at both maximal absorption wavelength are denoted as B₁ and B₂, the value of B(λ) in the laminated structure is obtained by the following expression.

$$(B(\lambda) \text{ in laminated structure}) = B_1 \times (A_1/(A_1 + A_2)) + B_2 \times (A_2/(A_1 + A_2))$$

In addition, in a case where the two or more light absorption anisotropic layers are provided and the maximal absorption wavelengths of the light absorption anisotropic layers are different from each other, it is preferable that B(λ) is obtained by the above-described method for each maximal absorption wavelength, and at least one B(λ) of the obtained B(λ)'s at the maximal absorption wavelength is in the above-described range. In a case where the two or more light absorption anisotropic layers are provided and the maximal absorption wavelengths of the light absorption anisotropic layers are different from each other, it is more preferable that the B(λ) to be obtained is in the above-described range at all maximal absorption wavelength.

The magnitude correlation of the absorption coefficients kx(λ), ky(λ), and kz(λ) can be known by the value of absorption anisotropy (diattenuation) of the sample measured using AxoScan of Axometrics, Inc. In addition, the degree of the absorption anisotropy A(λ) can be obtained by measuring the Mueller matrix at a plurality of wavelengths at predetermined range (for example, −70° to 70°) and predetermined intervals (for example, every 5°) of polar angles in in-plane slow axis direction using the above-described measurement device and fitting the measured values.

In addition, it is also preferable that a ratio of the smallest value of A(λ) of the light absorption anisotropic layer at a wavelength of 400 to 650 nm to the value of A(λ) at the maximal absorption wavelength of the light absorption anisotropic layer is 0.35 or less. Since the smallest value of A(λ) may be 0, examples of the lower limit of the above-described ratio include 0.00 or more.

The smallest value of A(λ) of the light absorption anisotropic layer at a wavelength of 400 to 650 nm is obtained by measurement at each wavelength kin the above-described method.

In a case where the two or more light absorption anisotropic layers are provided, the above-described ratio is obtained for each light absorption anisotropic layer, and it is preferable that the ratio in any of the light absorption anisotropic layers is in the above-described range, and it is more preferable that the ratio in all the light absorption anisotropic layers is in the above-described range.

In the light absorption anisotropic layer used in the present invention, the transmittance of the transmittance central axis is preferably 80% or more, more preferably 90% or more, and still more preferably 95% or more. In a case where the transmittance of the transmittance central axis is adjusted in the above-described preferred range, the illuminance at the center of the angle of view of the organic EL display device can be increased, and the visibility can be improved.

[Liquid Crystal Compound]

The light absorption anisotropic layer according to the embodiment of the present invention is formed of a composition containing a liquid crystal compound and a dichroic substance (hereinafter, also referred to as "liquid crystal composition"). Therefore, the light absorption anisotropic layer according to the embodiment of the present invention contains a liquid crystal compound. In a case where the light absorption anisotropic layer according to the embodiment of the present invention contains a liquid crystal compound, the dichroic substance can be aligned with a high alignment degree while the precipitation of the dichroic substances is suppressed.

The liquid crystal compound is a liquid crystal compound which does not exhibit dichroism.

As the liquid crystal compound, any of a low-molecular-weight liquid crystal compound or a high-molecular-weight liquid crystal compound can also be used, and it is preferable that both are used in combination. Here, "low-molecular-weight liquid crystal compound" indicates a liquid crystal compound having no repeating units in the chemical structure. In addition, the "high-molecular-weight liquid crystal compound" refers to a liquid crystal compound having a repeating unit in the chemical structure.

Examples of the low-molecular-weight liquid crystal compound include liquid crystal compounds described in JP2013-228706A.

Examples of the high-molecular-weight liquid crystal compound include thermotropic liquid crystalline polymers described in JP2011-237513A. Further, from the viewpoint that the strength (particularly, the bending resistance) of the light absorption anisotropic film is excellent, it is preferable that the high-molecular-weight liquid crystal compound has a repeating unit containing a crosslinkable group at the terminal. Examples of the crosslinkable group include the polymerizable groups described in paragraphs [0040] to [0050] of JP2010-244038A. Among these, from the viewpoint of improving the reactivity and the synthetic suitability, an acryloyl group, a methacryloyl group, an epoxy group, an oxetanyl group, and a styryl group are preferable, and an acryloyl group and a methacryloyl group are more preferable.

In a case where the light absorption anisotropic layer according to the embodiment of the present invention contains a high-molecular-weight liquid crystal compound, it is preferable that the high-molecular-weight liquid crystal compound forms a nematic liquid crystal phase.

The temperature at which the nematic liquid crystal phase is exhibited is preferably in a range of room temperature (23° C.) to 450° C. and preferably in a range of 50° C. to 400° C. from the viewpoints of handleability and manufacturing suitability.

The content of the liquid crystal compound is preferably in a range of 25 to 2000 parts by mass, more preferably in a range of 100 to 1300 parts by mass, and still more preferably in a range of 200 to 900 parts by mass with respect to 100 parts by mass of the content of the dichroic substances in the liquid crystal composition. In a case where the content of the liquid crystal compound is in the above-described ranges, the degree of alignment of the dichroic substance is further improved.

The liquid crystal compound may be contained only one kind or two or more kinds. In a case of containing two or more kinds of liquid crystal compounds, the above-described content of the liquid crystal compounds indicates the total content of the liquid crystal compounds.

From the viewpoint that the alignment degree is more excellent, it is preferable that the liquid crystal compound includes a high-molecular-weight liquid crystal compound containing a repeating unit represented by Formula (1L) (hereinafter, also referred to as "repeating unit (1L)").

$$—(P1)—$$
$$\underset{|}{\overset{}{}}$$
$$L1—SP1—M1—T1$$ (1L)

In Formula (1L), P1 represents the main chain of the repeating unit, L1 represents a single bond or a divalent linking group, SP1 represents a spacer group, M1 represents a mesogenic group, and T1 represents a terminal group.

Specific examples of the main chain of the repeating unit represented by P1 include groups represented by the following Formulae (P1-A) to (P1-D). In particular, the group represented by the following Formula (P1-A) is preferable from the viewpoint of diversity of monomers as raw materials and handleability.

(P1-A)

(P1-B)

(P1-C)

(P1-D)

In Formulae (P1-A) to (P1-D), "*" represents a bonding position to L1 in Formula (1L). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or an alkyl group having a cyclic structure (cycloalkyl group). In addition, the number of carbon atoms in the alkyl group is preferably 1 to 5.

It is preferable that the group represented by Formula (P1-A) is one unit of a partial structure of poly(meth)acrylic acid ester, which is obtained by polymerization of (meth)acrylic acid ester.

It is preferable that the group represented by Formula (P1-B) is an ethylene glycol unit formed by ring-opening polymerization of an epoxy group of a compound having the epoxy group.

It is preferable that the group represented by Formula (P1-C) is a propylene glycol unit formed by ring-opening polymerization of an oxetane group of a compound having an oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^4(OR^5)_2—$. In the formula, $R^4$ has the same definition as that for $R^4$ in Formula (P1-D), and a plurality of $R^5$'s each independently represent a hydrogen atom or an alkyl group having 1 to 10 carbon atoms.

L1 represents a single bond or a divalent linking group.

Examples of the divalent linking group represented by L1 include —C(O)O—, —OC(O)—, —O—, —S—, —C(O)$NR^3$—, —$NR^3$C(O)—, —$SO_2$—, and —$NR^3R^4$—. In the formulae, $R^3$ and $R^4$ each independently represent a hydrogen atom or an alkyl group having 1 to 6 carbon atoms which may have a substituent W (described below).

In a case where P1 represents a group represented by Formula (P1-A), from the viewpoint that the alignment degree is more excellent, it is preferable that L1 represents a group represented by —C(O)O—.

In a case where P1 represents a group represented by any of Formulae (P1-B) to (P1-D), from the viewpoint that the alignment degree is more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—$(CH_2—CH_2O)_{n1}$—* is preferable. In the formula, n1 represents an integer of 1 to 20, and "*" represents a bonding position with respect to L1 or M1 in Formula (1L). From the viewpoint that the alignment degree is more excellent, n1 represents preferably an integer of 2 to 10, more preferably an integer of 2 to 4, and most preferably an integer of 3.

In addition, from the viewpoint that the alignment degree is more excellent, a group represented by *—$(CH(CH_3)—CH_2O)_{n2}$—* is preferable as the oxypropylene structure represented by SP1. In the formula, n2 represents an integer of 1 to 3, and "*" represents a bonding position with respect to L1 or M1.

In addition, from the viewpoint that the alignment degree is more excellent, a group represented by *—$(Si(CH_3)_2—O)_{n3}$—* is preferable as the polysiloxane structure represented by SP1. In the formula, n3 represents an integer of 6 to 10, and "*" represents a bonding position with respect to L1 or M1.

In addition, from the viewpoint that the alignment degree is more excellent, a group represented by *—(CF$_2$—CF$_2$)$_{n4}$—* is preferable as the alkylene fluoride structure represented by SP1. In the formula, n4 represents an integer of 6 to 10, and * represents a bonding position to L1 or M1.

The mesogenic group represented by M1 is a group representing a main skeleton of liquid crystal molecules contributing to liquid crystal formation. A liquid crystal molecule exhibits liquid crystallinity which is in an intermediate state (mesophase) between a crystal state and an isotropic liquid state. The mesogen group is not particularly limited, and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystal Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint that the alignment degree is more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the alignment degree is more excellent, a group represented by Formula (M1-A) or Formula (M1-B) is preferable, and a group represented by Formula (M1-B) is more preferable as the mesogen group.

$$*-(\text{A1})_{\overline{a1}}-* \qquad \text{(M1-A)}$$

$$*-(\text{A2}-\text{LA1})_{\overline{a2}}\text{A3}-* \qquad \text{(M1-B)}$$

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent W described below.

It is preferable that the divalent group represented by A1 is a 4-membered to 6-membered ring. In addition, the divalent group represented by A1 may be a monocycle or a fused ring.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of the diversity of design of the mesogen skeleton and raw material availability, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms other than carbon, constituting a ring, these atoms may be the same or different from each other.

Specific examples of the divalent aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or more, a plurality of A1's may be the same or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the alignment degree is more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the alignment degree is more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi (CH$_3$)$_2$)$_g$— (g represents an integer of 1 to 10), —N(Z)—, —C(Z)═C(Z')—, —C(Z)═N—, —N═C(Z)—, —C(Z)$_2$—C(Z')$_2$—, —C(O)—, —OC(O)—, —C(O)O—, —O—C (O)O—, —N(Z)C(O)—, —C(O)N(Z)—, —C(Z)═C(Z')—C(O)O—, —O—C(O)—C(Z)═C(Z')—, —C(Z)═N—, —N═C(Z)—, —C(Z)═C(Z')—C(O)N(Z")—, —N(Z")—C(O)—C(Z)═C(Z')—, —C(Z)═C(Z')—C(O)—S—, —S—C(O)—C(Z)═C(Z')—, —C(Z)═N—N═C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N═N—, —S—, —S(O)—, —S(O)(O)—, —(O)S(O)O—, —O(O)S(O)O—, —SC(O)—, and —C(O) S—. Among these, —C(O)O— is preferable from the viewpoint that the alignment degree is more excellent. LA1 may be a group obtained by combining two or more of these groups.

Specific examples of M1 include the following structures. In the following specific examples, "Ac" represents an acetyl group.

15

16

-continued

-continued

-continued

-continued

Examples of the terminal group represented by Ti include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint that the alignment degree is more excellent, Ti represents preferably an alkoxy group having 1 to 10 carbon atoms, more preferably an alkoxy group having 1 to 5 carbon atoms, and still more preferably a methoxy group. These terminal groups may be further substituted with these groups or the above-described crosslinkable groups. From the viewpoint that the alignment degree is more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the alignment degree is further improved. Here, the "main chain" of T1 means the longest molecular chain bonded to M1, and the number of hydrogen atoms is not included in the number of atoms in the main chain of T1. For example, in a case where T1 is an n-butyl group, the number of atoms in the main chain is 4, and in a case where T1 is a sec-butyl group, the number of atoms in the main chain is 3.

From the viewpoint that the alignment degree is more excellent, the content is preferably in a range of 20% to 100% by mass with respect to 100% by mass of all the repeating units contained in the high-molecular-weight liquid crystal compound.

In the present invention, the content of each repeating unit contained in the high-molecular-weight liquid crystal compound is calculated based on the charged amount (mass) of each monomer used for obtaining each repeating unit.

The high-molecular-weight liquid crystal compound may have only one or two or more kinds of repeating units (1L). Among these, from the viewpoint that the alignment degree is more excellent, the high-molecular-weight liquid crystal compound may have two kinds of the repeating units (1L).

In a case where the high-molecular-weight liquid crystal compound has two kinds of the repeating units (1L), from the viewpoint that the alignment degree is more excellent, it is preferable that the terminal group represented by Ti in one (repeating unit A) is an alkoxy group and the terminal group represented by T1 in the other (repeating unit B) is a group other than the alkoxy group.

From the viewpoint that the alignment degree is more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the alignment degree is more excellent, the ratio (A/B) of the content of the repeating unit A in the high-molecular-weight liquid crystal compound to the content of the repeating unit B in the high-molecular-weight liquid crystal compound is preferably in a range of 50/50 to 95/5, more preferably in a range of 60/40 to 93/7, and still more preferably in a range of 70/30 to 90/10.

Further, the high-molecular-weight liquid crystal compound may have the repeating unit (1L) and a repeating unit containing no mesogen group. Examples of the repeating unit not having a mesogenic group include a repeating unit in which M1 in Formula (1L) represents a single bond.

In a case where the high-molecular-weight liquid crystal compound has a repeating unit containing no mesogen group, from the viewpoint that the alignment degree is more excellent, the content of the repeating unit is preferably greater than 0% by mass and 30% by mass or less and more preferably greater than 10% by mass and 20% by mass or less with respect to 100% by mass of all repeating units of the high-molecular-weight liquid crystal compound.

(Weight-Average Molecular Weight)

From the viewpoint that the alignment degree is more excellent, the weight-average molecular weight (Mw) of the high-molecular-weight liquid crystal compound is preferably in a range of 1,000 to 500,000 and more preferably in a range of 2,000 to 300,000. In a case where the Mw of the high-molecular-weight liquid crystal compound is in the above-described range, the high-molecular-weight liquid crystal compound is easily handled. In particular, from the viewpoint of suppressing cracking during coating, the weight-average molecular weight (Mw) of the high-molecular-weight liquid crystal compound is preferably 10,000 or more and more preferably 10,000 to 300,000.

In addition, from the viewpoint of temperature latitude of the alignment degree, the weight-average molecular weight (Mw) of the high-molecular-weight liquid crystal compound is preferably less than 10,000 and more preferably 2,000 or more and less than 10,000.

Here, the weight-average molecular weight and the number-average molecular weight in the present invention are values measured by a gel permeation chromatography (GPC) method.

Solvent (eluent): N-methylpyrrolidone

Device name: TOSOH HLC-8220GPC

Column: using three columns of TOSOH TSKgel Super
AWM-H (6 mm×15 cm) connected

Column temperature: 25° C.

Sample concentration: 0.1% by mass

Flow rate: 0.35 mL/min

Calibration curve: TSK standard polystyrene (manufactured by TOSOH Corporation), calibration curves of 7 samples with Mw of 2,800,000 to 1,050 (Mw/Mn=1.03 to 1.06) are used The Substituent W in the Present Specification Will be Described.

Examples of the substituent W include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a mor- pholino group, a maleimide group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfo- nic acid group, and a phosphoric acid group.

It is preferable that the wavelength dispersion of the liquid crystal compound used for forming the light absorption anisotropic layer according to the embodiment of the present invention is forward wavelength dispersion. The fact that the wavelength dispersion of the liquid crystal compound is forward wavelength dispersion means a case where a retar- dation layer obtained by homogeneously aligning the liquid crystal compound exhibits forward wavelength dispersion.

[Solvent]

The liquid crystal composition used for forming the light absorption anisotropic layer according to the embodiment of the present invention preferably contains a solvent from the viewpoint of workability or the like.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolane), aliphatic hydrocarbons (such as hexane), alicyclic hydrocar- bons (such as cyclohexane), aromatic hydrocarbons (such as benzene, toluene, xylene, and trimethylbenzene), haloge- nated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, buta- nol, cyclohexanol, isopentyl alcohol, neopentyl alcohol, diacetone alcohol, and benzyl alcohol), cellosolves (such as methyl cellosolve, ethyl cellosolve, and 1,2-dimethoxy- ethane), cellosolve acetates, sulfoxides (such as dimethyl sulfoxide), amides (such as dimethylformamide, dimethyl- acetamide, N-methylpyrrolidone, and N-ethylpyrrolidone), and heterocyclic compounds (such as pyridine), and water. These solvents may be used alone or in combination of two or more kinds thereof.

Among these solvents, ketones (particularly cyclopen- tanone and cyclohexanone), ethers (particularly tetrahydro- furan, cyclopentyl methyl ether, tetrahydropyran, and dioxo- lane), amides (particularly dimethylformamide, dimethylacetamide, and N-methylpyrrolidone, and N-eth- ylpyrrolidone) are preferable.

In a case where the liquid crystal composition contains a solvent, the content of the solvent is preferably 80% to 99% by mass, more preferably 83% to 98% by mass, and still more preferably 85% to 96% by mass with respect to the total mass of the liquid crystal composition.

In a case where the liquid crystal composition contains two or more kinds of solvents, the content of the solvent indicates the total content of the solvents.

[Dichroic Substance]

The light absorption anisotropic layer according to the embodiment of the present invention is formed of a com- position containing a liquid crystal compound and a dichroic substance (liquid crystal composition). Therefore, the light absorption anisotropic layer according to the embodiment of the present invention contains a dichroic substance. The dichroic substance used for forming the light absorption anisotropic layer according to the embodiment of the present invention is not particularly limited, and examples thereof include a visible light absorbing material (such as a dichroic coloring agent or a dichroic azo compound), a light emitting material (such as a fluorescent material or a phosphorescent material), an ultraviolet absorbing material, an infrared absorbing material, a non-linear optical material, a carbon nanotube, and an inorganic substance (for example, a quan- tum rod). Further, known dichroic substances (dichroic coloring agents) of the related art can be used.

The dichroic substance that is particularly preferably used is a dichroic azo coloring agent compound.

The dichroic azo coloring agent compound is not particu- larly limited, and a well-known dichroic azo coloring agent in the related art can be used, but the compounds described below are preferably used.

In the present invention, the dichroic azo coloring agent compound represents an azo coloring agent of which absor- bance varies depending on directions.

The dichroic azo coloring agent compound may or may not exhibit liquid crystallinity.

In a case where the dichroic azo coloring agent compound exhibits liquid crystallinity, any of nematic properties or smectic properties may be exhibited. The temperature range at which the liquid crystal phase is exhibited is preferably room temperature (approximately 20° C. to 28° C.) to 300° C., and from the viewpoint of handleability and manufac- turing suitability, more preferably 50° C. to 200° C.

In the present invention, two or more kinds of dichroic azo coloring agent compounds may be used in combination.

In the present invention, from the viewpoint of improving pressing resistance, it is preferable that the dichroic azo coloring agent compound has a crosslinkable group.

Specific examples of the crosslinkable group include a (meth)acryloyl group, an epoxy group, an oxetanyl group, and a styryl group. Among these, a (meth)acryloyl group is preferable.

Preferred examples of the dichroic azo coloring agent compound used in the present invention include a first dichroic azo coloring agent compound, a second dichroic azo coloring agent compound, and a third dichroic azo coloring agent compound.

(First Dichroic Azo Coloring Agent Compound)

In the present invention, a first dichroic azo coloring agent compound having a maximum absorption wavelength in a wavelength range of 560 nm or more and 700 nm or less can be preferably used.

It is preferable that the first dichroic azo coloring agent compound is a compound having a chromophore which is a nucleus and a side chain bonded to a terminal of the chromophore.

Specific examples of the chromophore include an aro- matic ring group (such as an aromatic hydrocarbon group or an aromatic heterocyclic group) and an azo group. In addi- tion, a structure containing both an aromatic ring group and an azo group is preferable, and a bisazo structure containing an aromatic heterocyclic group (preferably a thienothiazole group) and two azo groups is more preferable.

The side chain is not particularly limited, and examples thereof include a group represented by L3, R2, or L4 in Formula (3).

The maximum absorption wavelength (nm) of the dichroic azo coloring agent compound in the present speci- fication is acquired from an ultraviolet visible spectrum in a wavelength range of 380 to 800 nm, which is measured with a spectrophotometer using a solution prepared by dissolving the dichroic azo coloring agent compound in a good solvent.

In the present invention, from the viewpoint of further improving the alignment degree of the light absorption anisotropic layer to be formed, it is preferable that the first dichroic azo coloring agent compound is a compound represented by Formula (4).

Formula (4)

In Formula (4), Ar1 and Ar2 each independently represent a phenylene group which may have a substituent or a naphthylene group which may have a substituent. Among these, a phenylene group is preferable.

In Formula (4), R1 represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group.

Further, —CH$_2$— constituting the alkyl group may be substituted with —O—, —CO—, —C(O)—O—, —O—C (O)—, —Si(CH$_3$)$_2$—O—Si(CH$_3$)$_2$—, —N(R1')—, —N(R1')—CO—, —CO—N(R1')—, —N(R1')—C(O)— O—, —O—C(O)—N(R1')—, —N(R1')—C(O)—N(R1')—, —CH═CH—, —C≡C—, —N═N—, —C(R1')═CH—C (O)—, or —O—C(O)—O—.

In a case where R1 represents a group other than a hydrogen atom, the hydrogen atom in each group may be substituted with a halogen atom, a nitro group, a cyano group, —N(R1')$_2$, an amino group, —C(R1')═C(R1')— NO$_2$, —C(R1')═C(R1')—CN, or —C(R1')═C(CN)$_2$.

R1' represents a hydrogen atom or a linear or branched alkyl group having 1 to 6 carbon atoms. In a case where a plurality of (R1')'s are present in each group, these may be the same or different from each other.

In Formula (4), R2 and R3 each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

Further, —CH$_2$— constituting the alkyl group may be substituted with —O—, —S—, —C(O)—, —C(O)—O—, —O—C(O)—, —C(O)—S—, —S—C(O)—, —Si(CH$_3$)$_2$— —O—Si(CH$_3$)$_2$—, —NR2'—, —NR2'—CO—, —CO— NR2'—, —NR2'—C(O)—O—, —O—C(O)—NR2'—, —NR2'—C(O)—NR2'—, —CH═CH—, —C≡C—, —N═N—, —C(R2')═CH—C(O)—, or —O—C(O)— O—.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2') ═C(R2')—NO$_2$, —C(R2')═C(R2')—CN, or —C(R2')═C (CN)$_2$.

R2' represents a hydrogen atom or a linear or branched alkyl group having 1 to 6 carbon atoms. In a case where a plurality of (R2')'s are present in each group, these may be the same as or different from one another.

R2 and R3 may be bonded to each other to form a ring, or R2 or R3 may be bonded to Ar2 to form a ring.

From the viewpoint of the light fastness, it is preferable that R1 represents an electron-withdrawing group and R2 and R3 represent a group having a low electron-donating property.

Specific examples of R1 in such a group include an alkylsulfonyl group, an alkylcarbonyl group, an alkyloxy-carbonyl group, an acyloxy group, an alkylsulfonylamino group, an alkylsulfamoyl group, an alkylsulfinyl group, and an alkylureido group. Examples of R2 and R3 include a group having the following structure. The groups having the following structures are shown in a form having a nitrogen atom to which R2 and R3 are bonded in Formula (4).

Specific examples of the first dichroic azo coloring agent compound are shown below, but the present invention is not limited thereto.

31                                                            32

-continued (Second Dichroic Azo Coloring Agent Compound)

In the present invention, a second dichroic azo coloring agent compound having a maximum absorption wavelength in a wavelength range of 455 nm or more and less than 560 nm can be preferably used.

The second dichroic azo coloring agent compound is a compound different from the first dichroic azo coloring agent compound, and specifically, the chemical structure thereof is different from that of the first dichroic azo coloring agent compound.

It is preferable that the second dichroic azo coloring agent compound is a compound having a chromophore which is a nucleus of a dichroic azo coloring agent compound and a side chain bonded to a terminal of the chromophore.

Specific examples of the chromophore include an aromatic ring group (such as an aromatic hydrocarbon group and an aromatic heterocyclic group) and an azo group, and a structure having both the aromatic hydrocarbon group and the azo group is preferable, and a trisazo structure having the aromatic hydrocarbon group and two or three azo groups is more preferable.

The side chain is not particularly limited, and examples thereof include a group represented by R4, R5, or R6 in Formula (5).

From the viewpoint of further improving the alignment degree, it is preferable that the second dichroic azo coloring agent compound is a compound represented by Formula (5).

Formula (5)

$$R4 - Ar3 - N = N - [Ar4 - N = N]_n - Ar5 - N{\overset{R5}{\underset{R6}{\diagdown}}}$$

In Formula (5), n represents 1 or 2.

In Formula (5), Ar3, Ar4, and Ar5 each independently represent a phenylene group which may have a substituent, a naphthylene group which may have a substituent, or a heterocyclic group which may have a substituent.

The heterocyclic group may be aromatic or non-aromatic.

Examples of atoms other than carbon, constituting the aromatic heterocyclic group, include a nitrogen atom, a sulfur atom, and an oxygen atom. In a case where the aromatic heterocyclic group has a plurality of atoms other than carbon, constituting a ring, these atoms may be the same or different from each other.

Specific examples of the aromatic heterocyclic group include a pyridylene group (pyridine-diyl group), a pyridazine-diyl group, an imidazole-diyl group, thienylene group (thiophene-diyl group), a quinolylene group (quino-line-diyl group), an isoquinolylene group (isoquinoline-diyl group), an oxazole-diyl group, a thiazole-diyl group, an oxadiazole-diyl group, a benzothiazole-diyl group, a benzo-thiadiazole-diyl group, a phthalimido-diyl group, a thienothiazole-diyl group, a thiazolothiazole-diyl group, a thienothiophene-diyl group, and a thienooxazole-diyl group.

In Formula (5), R4 has the same definition as that for R1 in Formula (4).

In Formula (5), R5 and R6 each have the same definition as that for R2 and R3 in Formula (4).

From the viewpoint of the light resistance, it is preferable that R4 represents an electron-withdrawing group and R5 and R6 represent a group having a low electron-donating property.

Among such groups, specific examples of a case where R4 represents an electron-withdrawing group are the same as the specific examples of a case where R1 represents an electron-withdrawing group, and specific examples of a case where R5 and R6 represent a group having a low electron-donating property are the same as the specific examples of a case where R2 and R3 represent a group having a low electron-donating property.

Specific examples of the second dichroic azo coloring agent compound are shown below, but the present invention is not limited thereto.

-continued

-continued

-continued (Difference in Log P Value)

A log P value is an index expressing hydrophilicity and hydrophobicity of a chemical structure.

In the present invention, in a case where the first dichroic azo coloring agent compound and the second dichroic azo coloring agent compound are used in combination, an absolute value of a difference (hereinafter, also referred to as "difference in log P value") between a log P value of a side chain of the first dichroic azo coloring agent compound and a log P value of a side chain of the second dichroic azo coloring agent compound is preferably 2.30 or less, more preferably 2.0 or less, still more preferably 1.5 or less, and particularly preferably 1.0 or less. In a case where the difference in log P value is 2.30 or less, since affinity between the first dichroic azo coloring agent compound and the second dichroic azo coloring agent compound is enhanced and an arrangement structure is more easily formed, the alignment degree of the light absorption anisotropic layer is further improved.

In a case where the first dichroic azo coloring agent compound or the second dichroic azo coloring agent compound has a plurality of side chains, it is preferable that at least one difference in log P value is in the above-described ranges.

Here, the side chain of the first dichroic azo coloring agent compound and the side chain of the second dichroic azo coloring agent compound mean a group bonded to the terminal of the above-described chromophore. For example, R1, R2, and R3 in Formula (4) are the side chain in a case where the first dichroic azo coloring agent compound is the compound represented by Formula (4), and R4, R5, and R6 in Formula (5) are the side chain in a case where the second dichroic azo coloring agent compound is the compound represented by Formula (5). In particular, in a case where the first dichroic azo coloring agent compound is the compound represented by Formula (4) and the second dichroic azo coloring agent compound is the compound represented by Formula (5), it is preferable that at least one difference in log P value among the difference in log P value between R1 and R4, the difference in log P value between R1 and R5, the difference in log P value between R2 and R4, and the difference in log P value between R2 and R5 satisfies the above-described value.

Here, the log P value is an index for expressing properties of hydrophilicity and hydrophobicity of a chemical structure, and is also referred to as a hydrophilic-hydrophobic parameter. The log P value can be calculated using software such as ChemBioDraw Ultra or HSPiP (Ver. 4.1.07). In addition, the log P value can be acquired experimentally by the method of the OECD Guidelines for the Testing of Chemicals, Sections 1, Test No. 117, or the like. In the present invention, a value calculated by inputting the structural formula of a compound to HSPiP (Ver. 4.1.07) is adopted as the log P value unless otherwise specified.

(Third Dichroic Azo Coloring Agent Compound)

In the present invention, a third dichroic azo coloring agent compound having a maximum absorption wavelength in a wavelength range of 380 nm or more and 455 nm or less can be preferably used.

The third dichroic azo coloring agent compound is a dichroic azo coloring agent compound other than the first dichroic azo coloring agent compound and the second dichroic azo coloring agent compound, and specifically, a chemical structure thereof is different from those of the first dichroic azo coloring agent compound and the second dichroic azo coloring agent compound.

It is preferable that the third dichroic azo coloring agent compound contains a dichroic azo coloring agent represented by Formula (6).

42

In Formula (6), n1, n2, and n3 each independently represent an integer of 0 to 4. Provided that, an expression of "$n1+n2+n3≥0$" is satisfied in a case of "$λ=1$", and an expression of "$n1+n2+n3≥1$" is satisfied in a case of "$k$ 2".

In Formula (6), examples of the crosslinkable group represented by A and B include polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are more preferable from the viewpoint of further improving the solubility.

In Formula (6), $L_1$ represents a monovalent substituent in a case where a is 0, and $L_1$ represents a single bond or a divalent linking group in a case where a is 1. In addition, $L_2$ represents a monovalent substituent in a case where b is 0, and $L_2$ represents a single bond or a divalent linking group in a case where b is 1.

As the monovalent substituent represented by $L_1$ and $L_2$, a group to be introduced to increase the solubility of the dichroic substance or a group having an electron-donating property or an electron-withdrawing property which is to be introduced to adjust the color tone of the coloring agent is preferable.

Examples of the substituent include:

an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl (6)

40

In Formula (6), A and B each independently represent a crosslinkable group.

In Formula (6), a and b each independently represent 0 or 1. From the viewpoint that the alignment degree at 420 nm is excellent, it is preferable that both a and b represent 0.

In Formula (6), $L_1$ represents a monovalent substituent in a case where a is 0, and $L_1$ represents a single bond or a divalent linking group in a case where a is 1. In addition, $L_2$ represents a monovalent substituent in a case where b is 0, and $L_2$ represents a single bond or a divalent linking group in a case where b is 1.

In Formula (6), $Ar_1$ represents an (n1+2)-valent aromatic hydrocarbon group or heterocyclic group, $Ar_2$ represents an (n2+2)-valent aromatic hydrocarbon group or heterocyclic group, and $Ar_3$ represents an (n3+2)-valent aromatic hydrocarbon group or heterocyclic group.

In Formula (6), R1, $R_2$, and $R_3$ each independently represent a monovalent substituent. A plurality of $R_1$'s may be the same or different from each other in a case of "$n1≥2$", a plurality of $R_2$'s may be the same or different from each other in a case of "$n2≥2$", and a plurality of $R_3$'s may be the same or different from each other in a case of "$n3≥2$".

In Formula (6), k represents an integer of 1 to 4. In a case of "$k≥2$", a plurality of $Ar_2$'s may be the same or different from each other, and a plurality of $R_2$'s may be the same or different from each other.

group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10, and examples thereof include a methoxycarbonyl group, an ethoxycarbonyl, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a furyl group, a piperidyl group, a morpholino group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group.

These substituents may be further substituted with these substituents. In addition, in a case where two or more substituents are present, these may be the same or different from each other. Furthermore, if possible, these substituents may be bonded to each other to form a ring.

Examples of a group in which the above-described substituent is further substituted with the above-described substituent include an $R_B$—(O—$R_A)_{na}$— group which is a group in which an alkoxy group is substituted with an alkyl group. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, or a group in which these groups are further substituted with these groups (for example, $R_B$—(O—$R_A)_{na}$— group described above) is preferable; and an alkyl group, an alkoxy group, or a group in which these groups are further substituted with these groups (for example, $R_B$—(O —$R_A)_{na}$— group described above) is more preferable.

Examples of the divalent linking group represented by $L_1$ and $L_2$ include —O—, —S—, —CO—, —COO—, —OCO—, —O—CO—O—, —CO—NRN—, —O—CO—NRN—, —NRN—CO—NRN—, —SO$_2$—, —SO—, an alkylene group, a cycloalkylene group, an alkenylene group, and a group obtained by combining two or more of these groups.

In addition, in a case where A is not present, the "number of atoms in the main chain" of $L_1$ denotes the number of atoms in $L_1$ which does not have a branched chain. In a case where B is not present, the "number of atoms in the main chain" of $L_2$ denotes the number of atoms in $L_2$ which does not have a branched chain.

Specifically, in Formula (D1), the number of atoms in the main chain of $L_1$ (the number of atoms in the dotted frame on the left side of Formula (D1)) is 5, and the number of atoms in the main chain of $L_2$ (the number of atoms in the dotted frame on the right side of Formula (D1)) is 5. In addition, in Formula (D10), the number of atoms in the main chain of $L_1$ (the number of atoms in the dotted frame on the left side of Formula (D10)) is 7, and the number of atoms in the main chain of $L_2$ (the number of atoms in the dotted frame on the right side of Formula (D10)) is 5.

D1

D10

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same or different from each other.

From the viewpoint of further improving the solubility of the dichroic substance, the number of atoms in the main chain of at least one of $L_1$ or $L_2$ is preferably 3 or greater, more preferably 5 or greater, still more preferably 7 or greater, and particularly preferably 10 or greater. In addition, the upper limit value of the number of atoms in the main chain is preferably 20 or less and more preferably 12 or less.

On the other hand, from the viewpoint of further improving the alignment degree of the light absorption anisotropic layer, the number of atoms of the main chain of at least one of $L_1$ or $L_2$ is preferably in a range of 1 to 5.

Here, in a case where A is present in Formula (6), "main chain" of $L_1$ denotes a portion required for directly linking "A" with the "O" atom linked to $L_1$, and "number of atoms in the main chain" denotes the number of atoms constituting the above-described portion. Similarly, in a case where B is present in Formula (6), the "main chain" of $L_2$ denotes a portion required for directly linking "B" with the "O" atom linked to $L_2$, and the "number of atoms in the main chain" denotes the number of atoms constituting the portion. The "number of atoms in the main chain" does not include the number of atoms in a branched chain described below.

$L_1$ and $L_2$ may have a branched chain.

Here, in a case where A is present in Formula (6), the "branched chain" of $L_1$ denotes a portion other than the portion required for directly linking "A" with the "O" atom linked to $L_1$ in Formula (6). Similarly, in a case where B is present in Formula (6), the "branched chain" of $L_2$ denotes a portion other than the portion required for directly linking "B" with the "O" atom linked to $L_2$ in Formula (6).

In addition, in a case where A is not present in Formula (6), the "branched chain" of $L_1$ denotes a portion other than the longest atomic chain (that is, the main chain) extending from the "O" atom linked to $L_1$ in Formula (6), which is the starting point. Similarly, in a case where B is not present in Formula (6), the "branched chain" of $L_2$ denotes a portion other than the longest atomic chain (that is, the main chain) extending from the "O" atom linked to $L_2$ in Formula (6), which is a starting point.

The number of atoms in the branched chain is preferably 3 or less. In a case where the number of atoms in the branched chain is 3 or less, there is an advantage that the alignment degree of the light absorption anisotropic layer is further improved. The number of atoms in the branched chain does not include the number of hydrogen atoms.

In Formula (6), Ar1 represents an (n1+2)-valent (for example, a trivalent in a case where n1 is 1) aromatic hydrocarbon group or heterocyclic group, Ar$_2$ represents an (n2+2)-valent (for example, a trivalent in a case where n2 is 1) aromatic hydrocarbon group or heterocyclic group, and Ar₃ represents an (n3+2)-valent (for example, a trivalent in a case where n3 is 1) aromatic hydrocarbon group or heterocyclic group. Here, $Ar_1$ to $Ar_s$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by Ar1 to $A_r$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group). Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable. Specific examples of the third dichroic azo coloring agent compound are shown below, but the present invention is not limited thereto. In the following specific examples, n represents an integer of 1 to 10.

From the viewpoint that the alignment degree at 420 nm is excellent, a structure in which the third dichroic azo coloring agent compound does not contain a radically polymerizable group is preferable. Examples thereof include the following structures.

From the viewpoint that the alignment degree at a wavelength of 420 nm is particularly excellent, it is more preferable that the third dichroic azo coloring agent compound is a dichroic substance having a structure represented by Formula (1-1).

(1-1)

In Formula (1-1), $R_1$, $R_3$, $R_4$, $R_5$, n1, n3, $L_1$, and $L_2$ each have the same definition as that for $R_1$, $R_3$, $R_4$, $R_5$, n1, n3, $L_1$, and $L_2$ of Formula (4).

In Formula (1-1), $R_{21}$ and $R_{22}$ each independently have the same definition as that for $R_2$ in Formula (4).

In Formula (1-1), n21 and n22 each independently have the same definition as that for n2 in Formula (4).

An expression of "n1+n21+n22+n3≥1" is satisfied, and "n1+n21+n22+n3" is preferably 1 to 9 and more preferably 1 to 5.

Specific examples of the third dichroic azo coloring agent compound (dichroic substance having a structure represented by Formula (1-1)) are shown below, but the present invention is not limited thereto.

| No | $R_{D1}$ | $R_{D2}$ | $R_{D3}$ | $R_{D4}$ | $R_{D5}$ | $R_{D6}$ | $R_{D7}$ | $R_{D8}$ |
|---|---|---|---|---|---|---|---|---|
| D1 | $OC_4H_8C(O)OCH_2CH_3$ | H | H | H | $CH_3$ | H | H | $OCH_8C(O)OCH_2CH_3$ |
| D2 | $OC_4H_8C(O)OCH_3$ | H | H | H | $CH_3$ | H | H | $OC_4H_8C(O)OCH_3$ |
| D3 | $OC_4H_8C(O)OCH_2CH_3$ | H | H | H | $CH_3$ | H | H | $OC_{11}H_{23}$ |
| D4 | $OC_4H_8C(O)OCH_2CH_3$ | H | H | H | $CH_3$ | H | H | $OC_5H_{11}$ |
| D5 | $OC_4H_8C(O)OCH_2CH_3$ | H | H | H | $CH_3$ | H | H | $OCH_2CH_3$ |
| D6 | $OC_4H_8C(O)OCH_2CH_3$ | H | H | H | $CH_3$ | H | Cl | $OC_4H_8C(O)OCH_2CH_3$ |
| D7 | $OC_3H_8C(O)OCH_2CH_3$ | H | H | H | $CH_3$ | H | H | $OC_3H_8C(O)OCH_2CH_3$ |
| D8 | $OCH_8C(O)OCH_2CH_3$ | H | H | Cl | H | Cl | H | $OC_3H_8C(O)OCH_2CH_3$ |
| D9 | $OC_9H_{18}C(O)OCH_2CH_3$ | H | H | H | $CH_3$ | H | H | $OCH_{18}C(O)OCH_2CH_3$ |
| D10 | $OC_4H_8C(O)OCH_2CH=CH_2$ | H | H | H | $CH_3$ | H | H | $OC_4H_8C(O)OCH_2CH=CH_2$ |
| D11 | $OC_4H_8C(O)OCH_2CH_3$ | H | H | H | Cl | H | H | $OC_4H_3C(O)OCH_2CH_3$ |
| D12 | $OC_6H_4C(O)OCH_2CH_3$ | H | H | H | $CH_3$ | H | H | $OC_8H_4C(O)OCH_2CH_3$ |

| No | RE$_1$ | RE$_2$ | RE$_3$ | RE$_4$ | RE$_5$ | RE$_6$ | RE$_7$ |
|---|---|---|---|---|---|---|---|
| E1 | OC$_4$H$_8$C(O)OCH$_2$CH$_3$ | H | H | H | H | H | OC$_4$H$_8$C(O)OCH$_2$CH$_3$ |
| E2 | OC$_4$H$_8$C(O)OCH$_3$ | H | H | H | H | H | OC$_4$H$_8$C(O)OCH$_3$ |
| E3 | OC$_4$H$_8$C(O)OCH$_2$CH$_3$ | Cl | H | H | H | Cl | OC$_4$H$_8$C(O)OCH$_2$CH$_3$ |
| E4 | OC$_4$H$_8$C(O)OCH$_2$CH$_3$ | H | H | H | H | Cl | OC$_5$H$_{11}$ |
| E5 | OC$_4$H$_8$C(O)OCH$_2$CH$_3$ | H | H | CH$_3$ | H | H | OCH$_2$CH$_3$ |
| E6 | OC$_3$H$_6$C(O)OCH$_2$CH$_3$ | H | H | H | H | H | OC$_3$H$_6$C(O)OCH$_2$CH$_3$ |
| E7 | OC$_9$H$_{18}$C(O)OCH$_2$CH$_3$ | H | H | H | H | H | OC$_9$H$_{18}$C(O)OCH$_2$CH$_3$ |
| E8 | OC$_4$H$_8$C(O)OCH$_2$CH=CH$_2$ | H | H | H | H | H | OC$_4$H$_8$C(O)OCH$_2$CH=CH$_2$ |

| No | R$_{F1}$ | R$_{F2}$ | R$_{F3}$ | R$_{F4}$ | R$_{F5}$ | R$_{F6}$ |
|---|---|---|---|---|---|---|
| F1 | OC$_4$H$_8$C(O)OCH$_2$CH$_3$ | H | H | OC$_4$H$_8$C(O)OCH$_2$CH$_3$ | H | H |
| F2 | OC$_4$H$_8$C(O)OCH$_3$ | H | CH$_3$ | OC$_4$H$_8$C(O)OCH$_3$ | H | H |
| F3 | OC$_3$H$_8$C(O)OCH$_2$CH$_3$ | H | H | OC$_3$H$_6$C(O)OCH$_2$CH$_3$ | H | Cl |

(Content of Dichroic Substance)

The content of the dichroic substance is preferably in a range of 1% to 30% by mass, more preferably in a range of 1% to 20% by mass, and still more preferably in a range of 2% to 10% by mass with respect to the total mass of the solid content of the light absorption anisotropic layer. In a case where the content of the dichroic substance is in the above-described ranges, a light absorption anisotropic layer having a high alignment degree is easily to be obtained even in a case where the light absorption anisotropic layer is formed into a thin film. Therefore, a light absorption anisotropic layer having excellent flexibility is likely to be obtained. In addition, in a case where the content of the dichroic substance is 30% by mass or less, precipitation of the dichroic substance is less likely to occur, and a light absorption anisotropic layer having a high alignment degree is easily obtained.

The liquid crystal composition may contain components other than the liquid crystal compound and the dichroic coloring agent compound, and examples thereof include a solvent, a vertical alignment agent, an interface improver, a polymerizable component, and a polymerization initiator (such as a radical polymerization initiator). In this case, the light absorption anisotropic layer according to the embodiment of the present invention contains a solid component other than a liquid component (such as a solvent).

Hereinafter, each component will be described.

(Interface Improver)

As the interface improver, the interface improver described in the columns of the examples described below can be used.

In a case where the liquid crystal composition contains an interface improver, the content of the interface improver is preferably in a range of 0.001 to 5 parts by mass with respect to 100 parts by mass of the total amount of the dichroic coloring agent compound and the liquid crystal compound in the liquid crystal composition.

(Polymerizable Component)

Examples of the polymerizable component include a compound containing an acrylate (such as an acrylate monomer). In this case, the light absorption anisotropic layer according to the embodiment of the present invention contains a polyacrylate obtained by polymerizing the compound containing an acrylate.

Examples of the polymerizable component include the compounds described in paragraph 0058 of JP2017-122776A.

In a case where the liquid crystal composition contains a polymerizable component, the content of the polymerizable component is preferably in a range of 3 to 20 parts by mass with respect to 100 parts by mass of the total amount of the dichroic coloring agent compound and the liquid crystal compound in the liquid crystal composition.

(Vertical Alignment Agent)

Examples of the vertical alignment agent include a boronic acid compound and an onium salt.

As the boronic acid compound, a compound represented by Formula (30) is preferable.

Formula (30)

$$R^3 - B \overset{OR^1}{\underset{OR^2}{}}$$

In Formula (30), $R^1$ and $R^2$ each independently represent a hydrogen atom, a substituted or unsubstituted aliphatic hydrocarbon group, a substituted or unsubstituted aryl group, or a substituted or unsubstituted heterocyclic group.

$R^3$ represents a substituent containing a (meth)acryl group.

Specific examples of the boronic acid compound include a boronic acid compound represented by General Formula (I) described in paragraphs [0023] to [0032] of JP2008-225281A.

As the boronic acid compound, compounds shown below are also preferable.

208397A, the onium salts described in paragraphs 0024 to 0055 of JP2008-026730A, and the onium salts described in JP2002-37777A.

The content of the vertical alignment agent in the liquid crystal composition is preferably in a range of 0.1% to 400% by mass and more preferably in a range of 0.5% to 350% by mass with respect to the total mass of the liquid crystal compound.

The vertical alignment agent may be used alone or in combination of two or more kinds thereof. In a case where two or more kinds of vertical alignment agents are used, the total amount thereof is preferably within the above-described range.

(Leveling Agent Suitable for Vertical Alignment)

In a case of vertical alignment, it is preferable that the composition contains a leveling agent described below. In a case where the liquid crystal composition contains a leveling agent, roughening of the surface state due to the drying air

I-34)

I-35)

I-36)

As the onium salt, a compound represented by Formula (31) is preferable.

Formula (31)

$$P^1 - Z - Y^1 - L^1 - \overset{\oplus}{N} \overset{L^2 - P^2}{\underset{X^{\ominus}}{A}}$$

In Formula (31), the ring A represents a quaternary ammonium ion consisting of a nitrogen-containing heterocyclic ring. X represents an anion. $L^1$ represents a divalent linking group. $L^2$ represents a single bond or a divalent linking group. $Y^1$ represents a divalent linking group having a 5- or 6-membered ring as a partial structure. Z represents a divalent linking group having an alkylene group having 2 to 20 carbon atoms as a partial structure. $P^1$ and $P^2$ each independently represent a monovalent substituent having a polymerizable ethylenically unsaturated bond.

Specific examples of the onium salt include the onium salts described in paragraphs 0052 to 0058 of JP2012- on the surface of the light absorption anisotropic layer is suppressed, and the dichroic substance is more uniformly aligned.

The leveling agent is not particularly limited, and a leveling agent having a fluorine atom (fluorine-based leveling agent) or a leveling agent having a silicon atom (silicon-based leveling agent) is preferable, and a fluorine-based leveling agent is more preferable.

Examples of the fluorine-based leveling agent include fatty acid esters of polyvalent carboxylic acid, in which a part of a fatty acid is substituted with a fluoroalkyl group, and polyacrylates having a fluoro substituent. Particularly in a case where a rod-like compound is used as the dichroic substance and the liquid crystal compound, a leveling agent having a repeating unit derived from a compound represented by Formula (40) is preferable from the viewpoint of promoting the vertical alignment of the dichroic substance and the liquid crystal compound.

Formula (40)

$$R^0$$
$$L \!-\!\!(CF_2)_n H$$

$R^0$ represents a hydrogen atom, a halogen atom, or a methyl group.

L represents a divalent linking group. It is preferable that L represents an alkylene group having 2 to 16 carbon atoms, and optional —CH$_2$— that is not adjacent to the alkylene group may be substituted with —O—, —COO—, —CO—, or —CONH—.

n represents an integer of 1 to 18.

The leveling agent having a repeating unit derived from a compound represented by Formula (40) may further have other repeating units.

Examples of the other repeating units include a repeating unit derived from a compound represented by Formula (41).

Formula (41)

$$R^{11}$$
$$X\!-\!R^{12}$$
$$O$$

$R^{11}$ represents a hydrogen atom, a halogen atom, or a methyl group.

X represents an oxygen atom, a sulfur atom, or —N(R$^{13}$)—. R$^{13}$ represents a hydrogen atom or an alkyl group having 1 to 8 carbon atoms.

$R^{12}$ represents a hydrogen atom, an alkyl group which may have a substituent, or an aromatic group which may have a substituent. The number of carbon atoms of the alkyl group is preferably in a range of 1 to 20. The alkyl group may be any of linear, branched, or cyclic.

In addition, examples of the substituent that the alkyl group may have include a poly(alkyleneoxy) group and a polymerizable group. The definition of the polymerizable group is as described above.

In a case where the leveling agent has a repeating unit derived from a compound represented by Formula (40) and a repeating unit derived from a compound represented by Formula (41), the content of the repeating unit derived from the compound represented by Formula (40) is preferably in a range of 10% to 90% by mole and more preferably in a range of 15% to 95% by mole with respect to all the repeating units of the leveling agent.

In the case where the leveling agent has a repeating unit derived from a compound represented by Formula (40) and a repeating unit derived from a compound represented by Formula (41), the content of the repeating unit derived from the compound represented by Formula (41) is preferably in a range of 10% to 90% by mole and more preferably in a range of 5% to 85% by mole with respect to all the repeating units of the leveling agent.

In addition, examples of the leveling agent include a leveling agent having a repeating unit derived from a compound represented by Formula (42) in place of the repeating unit derived from a compound represented by Formula (40).

Formula (42)

$$R^2$$
$$L^2\!-\!C_nF_{2n+1}$$

$R^2$ represents a hydrogen atom, a halogen atom, or a methyl group.

$L^2$ represents a divalent linking group.

n represents an integer of 1 to 18.

Specific examples of the leveling agent include the compounds described in paragraphs 0046 to 0052 of JP2004-331812A and the compounds described in paragraphs 0038 to 0052 of JP2008-257205A.

The content of the leveling agent in the liquid crystal composition is preferably in a range of 0.001% to 10% by mass and more preferably in a range of 0.01% to 5% by mass with respect to the total mass of the liquid crystal compound.

The leveling agent may be used alone or in combination of two or more kinds thereof. In a case where two or more kinds of leveling agents are used, the total amount thereof is preferably within the above-described range.

<Polymerization Initiator>

It is preferable that the liquid crystal composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A; 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A; 2,951,758A), a combination of a triarylimidazole dimer and a p-aminophenyl ketone (U.S. Pat. No. 3,549,367A), acridine and phenazine compounds (JP1985-105667A(JP-S60-105667A) and U.S. Pat. No. 4,239,850A), oxadiazole compounds (U.S. Pat. No. 4,212,970A), o-acyloxime compounds ([0065] of JP2016-27384A), and acylphosphine oxide compounds (JP1988-40799B (JP-S63-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE-184, IRGACURE-907, IRGACURE-369, IRGACURE-651, IRGACURE-819, IRGACURE-OXE-01, and IRGACURE-OXE-02, manufactured by BASF SE.

In a case where the liquid crystal composition contains a polymerization initiator, a content of the polymerization initiator is preferably 0.01 to 30 parts by mass and more preferably 0.1 to 15 parts by mass with respect to a total of 100 parts by mass of the above-described dichroic substance and the above-described liquid crystal compound in the liquid crystal composition. The durability of the light absorption anisotropic layer is enhanced in a case where the content of the polymerization initiator is 0.01 parts by mass or more, and the alignment degree of the light absorption anisotropic layer is improved in a case where the content thereof is 30 parts by mass or less.

The polymerization initiator may be used alone or in combination of two or more kinds thereof. In a case of containing two or more kinds of polymerization initiators, it is preferable that the total amount thereof is within the above-described range.

<Transparent Substrate Film>

The organic EL display device according to the embodiment of the present invention may include a transparent substrate film.

In the organic EL display device, the transparent substrate film is preferably disposed on a visible side of the light absorption anisotropic layer.

As the transparent substrate film, a known transparent resin film such as a transparent resin plate, a transparent resin sheet, or the like can be used without particular limitation. Examples of the transparent resin film include a cellulose acylate film (such as a cellulose triacetate film (refractive index of 1.48), a cellulose diacetate film, a cellulose acetate butyrate film, or a cellulose acetate propionate film), cyclic olefin-based resin film, a polyethylene terephthalate film, a polyether sulfone film, a polyacrylic resin film, a polyurethane-based resin film, a polyester film, a polycarbonate film, a polysulfone film, a polyether film, a polymethylpentene film, a polyether ketone film, and a (meth)acrylonitrile film.

Among these, a cellulose acylate film which is highly transparent, has a small optical birefringence, is easily produced, and is typically used as a protective film of a polarizing plate is preferable, and a cellulose triacetate film is particularly preferable.

The thickness of the transparent substrate film is usually 20 m to 100 μm.

<Alignment Film>

The organic EL display device according to the embodiment of the present invention may have an alignment film between the transparent substrate film and the light absorption anisotropic layer.

The alignment film may be any layer as long as the dichroic coloring agent compound can be in a desired alignment state on the alignment film.

For example, a film formed of a polyfunctional acrylate compound or polyvinyl alcohol may be used.

<Method of Forming Light Absorption Anisotropic Layer>

A method of forming a light absorption anisotropic layer is not particularly limited, and examples thereof include a method including, in the following order, a step of applying the above-described liquid crystal composition (hereinafter, may be also referred to as "composition for forming a light absorption anisotropic layer") to form a coating film (hereinafter, also referred to as "coating film forming step") and a step of aligning a liquid crystalline component or a dichroic substance contained in the coating film (hereinafter, also referred to as "alignment step").

In a case where the above-described dichroic substance has liquid crystallinity, the liquid crystalline component is a component which also includes the dichroic substance having liquid crystallinity in addition to the above-described liquid crystal compound.

[Coating Film Forming Step]

The coating film forming step is a step of applying the composition for forming a light absorption anisotropic layer to form a coating film.

The composition for forming a light absorption anisotropic layer can be easily applied by using a composition for forming a light-absorbing anisotropic layer, which contains the above-described solvent, or using a liquid such as a melt obtained by heating the composition for forming a light absorption anisotropic layer.

Specific examples of a method of applying the composition for forming a light absorption anisotropic layer include known methods such as a roll coating method, a gravure printing method, a spin coating method, a wire bar coating method, an extrusion coating method, a direct gravure coating method, a reverse gravure coating method, a die coating method, a spraying method, and an ink jet method.

[Aligning Step]

The aligning step is a step of aligning the liquid crystalline component contained in the coating film. In this manner, the light absorption anisotropic layer is obtained.

The alignment step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystalline components contained in the composition for forming a light absorption anisotropic layer may be aligned by the coating film forming step or the drying treatment described above. For example, in an embodiment in which the composition for forming a light absorption anisotropic layer is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to a transition temperature of the liquid crystalline component contained in the coating film to the liquid crystal phase, a heat treatment described below may not be performed.

From the viewpoint of manufacturing suitability or the like, the transition temperature of the liquid crystalline component contained in the coating film to the liquid crystal phase is preferably 10° C. to 250° C. and more preferably 25° C. to 190° C. In a case where the above-described transition temperature is 10° C. or higher, a cooling treatment or the like for lowering the temperature to a temperature range in which the liquid crystal phase is exhibited is not necessary, which is preferable. In addition, in a case where the above-described transition temperature is 250° C. or lower, a high temperature is not required even in a case of setting an isotropic liquid state at a temperature higher than the temperature range in which the liquid crystal phase is temporarily exhibited, and waste of thermal energy and deformation and deterioration of a substrate can be reduced, which is preferable.

It is preferable that the alignment step includes a heat treatment. In this manner, since the liquid crystalline component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. In addition, the heating time is preferably 1 to 300 seconds and more preferably 1 to 60 seconds.

The alignment step may include a cooling treatment performed after the heat treatment. The cooling treatment is a treatment of cooling the heated coating film to room temperature (20° C. to 25° C.). In this manner, the alignment of the liquid crystalline component contained in the coating film can be fixed. The cooling means is not particularly limited and can be performed according to a known method.

The light absorption anisotropic film can be obtained by performing the above-described steps.

In the present embodiment, examples of a method of aligning the liquid crystalline component contained in the coating film include the drying treatment and the heat treatment, but the present invention is not limited thereto, and the liquid crystalline component can be aligned by a known alignment treatment.

[Other Steps]

The method of forming the light absorption anisotropic layer may include a step of curing the light absorption anisotropic layer after the alignment step (hereinafter, also referred to as "curing step").

The curing step is performed by heating the light absorption anisotropic layer and/or irradiating the light absorption anisotropic layer with light (exposing the light-absorbing anisotropic layer to light), for example, in a case where the light-absorbing anisotropic layer has a crosslinkable group (polymerizable group). Among these, it is preferable that the curing step is performed by irradiating the light absorption anisotropic layer with light.

Various light sources such as infrared rays, visible light, and ultraviolet rays can be used as a light source for curing, but ultraviolet rays are preferable. In addition, ultraviolet rays may be applied while the layer is heated during curing, or ultraviolet rays may be applied through a filter which transmits only a specific wavelength.

In a case where the exposure is performed while the layer is heated, the heating temperature during the exposure depends on the transition temperature of the liquid crystalline component contained in the liquid crystal film to the liquid crystal phase, but it is preferably 25° C. to 140° C.

In addition, the exposure may be performed under a nitrogen atmosphere. In a case where the curing of the liquid crystal film proceeds by radical polymerization, since inhibition of polymerization by oxygen is reduced, it is preferable that the exposure is performed in a nitrogen atmosphere.

The thickness of the light absorption anisotropic layer is not particularly limited, but is preferably in a range of 100 to 8,000 nm and more preferably in a range of 100 to 1,000 nm from the viewpoint of the flexibility.

In the organic EL display device according to the embodiment of the present invention may be an aspect including only one light absorption anisotropic layer, or may be an aspect including two or more light absorption anisotropic layers.

In a case where the organic EL display device according to the embodiment of the present invention includes two or more light absorption anisotropic layers, the light absorption anisotropic layers may have the same configuration or different configurations. The different configurations mean that an angle between a transmittance central axis of the light absorption anisotropic layer and a normal line of a layer plane of the light absorption anisotropic layer may be different from each other, or that the dichroic substances contained in the light absorption anisotropic layer may be different from each other. By combining light absorption anisotropic layers having different configurations, it is possible to suppress the change in tint in a plurality of directions and/or a plurality of wavelength ranges.

<Polarizer>

The organic EL display device according to the embodiment of the present invention may further include a polarizer. The polarizer is not particularly limited, and a known polarizer can be used. For example, the polarizer may be a polarizer in which a dichroic substance is horizontally aligned by dyeing and stretching the dichroic substance on polyvinyl alcohol or another polymer resin or a polarizer in which a dichroic substance is horizontally aligned by applying alignment of a liquid crystal compound as in a case of the light absorption anisotropic layer according to the embodiment of the present invention, but a polarizer in which the dichroic substance is aligned by using the alignment properties of the liquid crystal without stretching is particularly preferable.

The polarizer in which a dichroic substance is aligned using the aligning properties of the liquid crystal has various advantages that the thickness thereof is in a range of 0.1 m to 5 m, which is extremely small, cracking is unlikely to occur during bending as described in JP2019-194685A, thermal deformation is less likely to occur, the durability is excellent even in a case of a polarizing plate with a high transmittance of greater than 50% as described in JP6483486B, and the like.

Taking advantage of these advantages, it can be used for applications where high brightness and small size and light weight are required, applications of a fine optical system, applications of molding to a portion having a curved surface, and applications to a flexible portion. In addition, in a case where a polarizing plate having a high transmittance of more than 50% is used in an organic EL display device in which a reflectivity of a screen display panel is less than 30%, both of the high brightness and the suppression of the decrease in visibility due to the reflection of external light can be achieved.

In the organic EL display device according to the embodiment of the present invention, the polarizer is preferably disposed on the organic EL display element side of the light absorption anisotropic layer. That is, in a case where the organic EL display device according to the embodiment of the present invention includes a polarizer, the light absorption anisotropic layer is preferably disposed on a visible side of the polarizer. With such a configuration, it is possible to suppress the change in tint in the oblique direction in the white display.

In addition, the polarizer may be used in combination with a λ/4 film to exhibit a function of a circularly polarizing plate. That is, the organic EL display device according to the embodiment of the present invention may include a circularly polarizing plate. In a case where the organic EL display device according to the embodiment of the present invention includes a circularly polarizing plate, the organic EL display device preferably includes a polarizer, a λ/4 film, and an organic EL display element in this order from the visible side.

The λ/4 film is a plate (film) having a function of generating a phase difference corresponding to λ/4 of a wavelength a, and specifically, is a plate (film) having a function of converting linearly polarized light of a specific wavelength into circularly polarized light (or converting circularly polarized light into linearly polarized light).

The λ/4 film may be formed of a single layer of an optically anisotropic layer, or may be formed of a plurality of optically anisotropic layers. For the λ/4 film consisting of a plurality of optically anisotropic layers, for example, the description in paragraphs [0008] to [0053] of JP2014-209219A can be referred to.

Specific examples of the aspect in which the λ/4 film has a single-layer structure include a stretched polymer film and a retardation film in which an optically anisotropic layer having a λ/4 function is provided on a support. Specific examples of the aspect in which the λ/4 plate has a multilayer structure include a broadband λ/4 plate formed by laminating a λ/4 plate and a λ/2 plate.

In addition, such a λ/4 film and the light absorption anisotropic layer described later may be provided by coming into contact with each other, or another layer may be provided between the λ/4 film and the light absorption anisotropic layer. Examples of such a layer include a pressure-sensitive adhesive layer and an adhesive layer for ensuring adhesiveness.

<Polarization Control Layer>

The organic EL display device according to the embodiment of the present invention may further include a polarization control layer.

The polarization control layer refers to a layer in which a polarization state of light incident on the layer is changed.

Examples of the polarization control layer include a retardation layer and a depolarization layer. Examples of the retardation layer include a λ/4 film.

In a case where the organic EL display device according to the embodiment of the present invention includes the above-described polarizer, the polarization control layer is preferably disposed on a visible side of the polarizer.

[λ/4 Film]

The λ/4 film which may be provided in the organic EL display device according to the embodiment of the present invention is a plate having a function of generating a phase difference corresponding to λ/4 of a wavelength a, and is specifically the same as the λ/4 film used in the above-described circularly polarizing plate. However, the λ/4 film as the polarization control layer is a layer different from the λ/4 film included in the circularly polarizing plate described above.

In a case where the organic EL display device according to the embodiment of the present invention includes the λ/4 film as the polarization control layer and includes the above-described polarizer, the λ/4 film is preferably disposed on a visible side of the polarizer. With such a configuration, it is possible to suppress the change in tint in the oblique direction in the white display.

In a case of using the λ/4 film, it is also preferable that the above-described Rth of the light absorption anisotropic layer at the maximal absorption wavelength of the light absorption anisotropic layer is in the above-described preferred range (for example, −200 to −20 nm).

[Depolarization Layer]

The depolarization layer which may be included in the organic EL display device according to the embodiment of the present invention may be of any type as long as it has an ability to convert a part or all of linearly polarized light into natural light (randomly polarized light). Among these, examples of a preferred aspect of the present invention include a randomly aligned liquid crystal layer and a layer containing fine particles. From the viewpoint that the depolarization ability is easily obtained and a transparent layer is easily obtained without whitening derived from the domain in the layer, examples of a particularly preferred aspect include a randomly aligned liquid crystal layer.

(Randomly Aligned Liquid Crystal Layer)

The randomly aligned liquid crystal layer refers to a liquid crystal layer in which an alignment direction of the liquid crystal is randomly directed in various directions in a liquid crystal state such as a nematic phase or a smectic phase. A randomly aligned liquid crystal layer in a liquid crystal state of a nematic phase is more preferable. The randomly aligned liquid crystal layer can be prepared by providing a liquid crystal layer that contains a photopolymerization initiator and a liquid crystal containing a photopolymerizable group on a support that has not been subjected to an alignment treatment such as a rubbing treatment, heating the layer as necessary so that the layer enters a liquid crystal state (such as a nematic phase or a smectic phase), exposing the layer to ultraviolet rays, and immobilizing the alignment state.

[Layer Containing Fine Particles]

The depolarization layer can be prepared by using the above-described randomly aligned liquid crystal layer, or can be prepared by using a layer which generates a certain degree of light scattering in the layer. The depolarization occurs when light is scattered in the layer. As the fine particles, inorganic particles such as silica, alumina, zircon, and zirconia, or organic fine particles such as an acrylic resin, a melamine resin, and a polyamide resin can be used. As the size, various sizes of particles having a diameter of about 0.1 to 3 m can be used. As the shape, various shape such as a spherical shape, a rod-like shape, a fibrous shape, can be used. In addition, the degree of depolarization can also be adjusted by using the above-described aspects in combination.

The polarizing film is described in detail in JP2012-027259A, JP2011-257479A, and the like, which can also be referred to.

<Barrier Layer>

The organic EL display device according to the embodiment of the present invention preferably includes a barrier layer.

Here, the barrier layer is also referred to as a gas-shielding layer (oxygen-shielding layer), and has a function of protecting the polarizer of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

<Refractive Index Adjusting Layer>

In the organic EL display device according to the embodiment of the present invention, the above-described light absorption anisotropic layer may have a dichroic substance, and in a case where internal reflection caused by the high refractive index of the light absorption anisotropic layer is a problem. In that case, it is preferable that the refractive index adjusting layer is present. The refractive index adjusting layer is a layer disposed to be in contact with the light absorption anisotropic layer, and the in-plane average refractive index at a wavelength of 550 nm is preferably 1.55 or greater and 1.70 or less. In addition, it is also preferable that the refractive index adjusting layer is a refractive index adjusting layer for performing so-called index matching.

<Tint Adjusting Layer>

The organic EL display device according to the embodiment of the present invention may include a tint adjusting layer containing at least one coloring agent compound. It is preferable that the coloring agent compound contained in the tint adjusting layer is in a non-aligned state.

In a case where the amount of the coloring agent in the light absorption anisotropic layer is adjusted, a change in tint as viewed in an oblique direction with respect to the transmittance central axis may be increased, but in this case, the change in tint in a case of being viewed in the oblique direction from the transmittance central axis can be suppressed by adjusting the tint using the tint adjusting layer.

The tint adjusting layer may have only the function of the tint adjusting layer or may have functions integrated with functions of other layers.

The absorption peak wavelength of the coloring agent compound contained in the tint adjusting layer used in the present invention is preferably 500 nm or greater and 650 nm or less and more preferably 550 nm or greater and 600 nm or less. By setting the absorption of the coloring agent compound in this range, the tint of the organic EL display device according to the embodiment of the present invention can be adjusted to be more neutral.

Examples of the coloring agent compound contained in the tint adjusting layer include azo, methine, anthraquinone, triarylmethane, oxazine, azomethine, phthalocyanine, porphyrin, perylene, pyrrolopyrrole, and squarylium. Among these, from the viewpoints of enhancing the absorption waveform, the heat resistance, and the light resistance, azo, phthalocyanine, and anthraquinone are preferable, and anthraquinone is particularly preferable. Other examples thereof include coloring agent compounds described in "Functional Coloring Agents", co-authored by Shin Okawara, Ken Matsuoka, Tsuneaki Hirashima, and Eijiro Kitao, Kodansha Ltd., 1992, supervised by Sumio Tokita, and "Electronics-related Materials", CMC Publishing Co., Ltd., 1998.

Hereinafter, specific examples of the coloring agent compound used in the tint adjusting layer according to the embodiment of the present invention are shown below, but the coloring agent compound is not limited thereto.

Anthraquinone

Anthraquinone

A-1

A-2

A-3

A-4

A-5

A-6

65 66

A-7

A-8

A-9

A-10

A-11

A-12

Azo

B-1

B-2

B-3

B-4

-continued

B-5

B-6

Triarylmethane

T-1

T-2

Oxazine

O-1

O-2

Phthalocyanine

PH-1

R = SO₃Na

<Pressure-Sensitive Adhesive Layer>

The organic EL display device according to the embodiment of the present invention may include a pressure-sensitive adhesive layer.

It is preferable that the pressure-sensitive adhesive layer in the present invention is a transparent and optically isotropic adhesive similar to that used in a typical liquid crystal display device, and a pressure sensitive type adhesive is typically used.

The pressure-sensitive adhesive layer of the present invention may be blended with appropriate additives such as a crosslinking agent (such as an isocyanate-based crosslinking agent or an epoxy-based crosslinking agent), a viscosity imparting agent (such as a rosin derivative resin, a polyterpene resin, a petroleum resin, or an oil-soluble phenol resin), a plasticizer, a filler, an antiaging agent, a surfactant, an ultraviolet absorbing agent, a light stabilizer, and an antioxidant in addition to a parent material (pressure sensitive adhesive), conductive particles, and thermally expandable particles used as necessary.

A thickness of the pressure-sensitive adhesive layer is typically 3 to 200 μm, preferably 5 to 30 μm. Required adhesive strength or rework suitability may not be obtained in a case where the thickness thereof is less than 3 μm, and the pressure sensitive adhesive may protrude or bleed out from the peripheral end portion of the image display device in a case where the thickness thereof is more than 200 μm.

The pressure-sensitive adhesive layer can be formed by an appropriate method such as a method of directly coating a support for a protective member with a coating solution containing a parent material, conductive particles, and as necessary, thermally expandable particles, an additive, a solvent, and the like and pressure-bonding the support through a release liner or a method of coating an appropriate release liner (release paper or the like) with a coating solution to form a thermally expandable pressure-sensitive adhesive layer, and pressure-bonding and transferring (transporting) the layer onto the support for a protective member.

In addition, for example, a configuration in which conductive particles are added to a configuration of a thermally-releasable pressure-sensitive adhesive sheet described in JP2003-292916A can be employed as the protective member.

Furthermore, a member in which conductive particles are sprayed on the surface of a pressure-sensitive adhesive layer in commercially available products such as "REVALPHA" manufactured by Nitto Denko Corporation may be used as the protective member.

<Adhesive Layer>

In the present invention, in a case where the above-described members are bonded to each other, an adhesive may be used. That is, the organic EL display device according to the embodiment of the present invention may include an adhesive layer.

The adhesive exhibits adhesiveness due to drying or a reaction after bonding.

A polyvinyl alcohol-based adhesive (PVA-based adhesive) exhibits adhesiveness due to drying, and is capable of bonding materials to each other.

Specific examples of the curable adhesive which exhibits adhesiveness due to reaction include an active energy ray-curable adhesive such as a (meth) acrylate-based adhesive and a cationic polymerization curable adhesive. The (meth) acrylate denotes acrylate and/or methacrylate. Examples of the curable component in the (meth)acrylate-based adhesive include a compound containing a (meth)acryloyl group and a compound containing a vinyl group. In addition, as the cationic polymerization curable adhesive, a compound having an epoxy group or an oxetanyl group can also be used. The compound having an epoxy group is not particularly limited as long as the compound has at least two epoxy groups in a molecule, and various generally known curable epoxy compounds can be used. Preferred examples of the epoxy compound include a compound (aromatic epoxy compound) having at least two epoxy groups and at least one aromatic ring in the molecule and a compound (alicyclic epoxy compound) having at least two epoxy groups in the molecule, in which at least one of the epoxy groups is formed between two adjacent carbon atoms constituting an alicyclic ring.

Among these, from the viewpoint of heat deformation resistance, an ultraviolet curable adhesive which is cured by irradiation with ultraviolet rays is preferably used.

An ultraviolet absorbing ability may be imparted into the adhesive layer or each layer of the pressure-sensitive adhesive layer by a method of performing a treatment with an ultraviolet absorbing agent such as a salicylic acid ester-based compound, a benzophenol-based compound, a benzotriazole-based compound, a cyanoacrylate-based compound, or a nickel complex salt-based compound.

The pressure-sensitive adhesive layer and the adhesive layer can be attached to a object in an appropriate manner. Examples thereof include a method of preparing a pressure-sensitive adhesive solution containing 10% to 40% by weight of the base polymer or a composition thereof, which is dissolved or dispersed in a solvent consisting of a single substance or a mixture of an appropriate solvent such as toluene or ethyl acetate, and directly attaching the pressure-sensitive adhesive solution to the object by an appropriate development method such as a casting method or a coating method, and a method of forming a pressure-sensitive adhesive layer on a separator according to the above and transferring the pressure sensitive layer.

The pressure-sensitive adhesive layer or the adhesive layer can also be provided on one surface or both surfaces of the film as a superimposed layer of a film having a different composition, type, or the like. In addition, in a case where the pressure-sensitive adhesive layer or the adhesive layer is provided on both surfaces of the object, the pressure-sensitive adhesive layer or the adhesive layer can be a pressure-sensitive adhesive layer or an adhesive layer having different compositions, types, thicknesses, and the like on the front and back of the object.

<Organic EL Display Element>

The organic EL display device according to the embodiment of the present invention includes an organic EL display element.

As the organic EL display device, a known device can be used. Examples of the organic EL display element include a display element in which a light emitting layer or a plurality of organic compound thin films containing a light emitting layer is formed between a pair of electrodes of an anode and a cathode. The organic compound thin film may include a hole injection layer, a hole transport layer, an electron injection layer, an electron transport layer, a protective layer, or the like, in addition to the light emitting layer, and these layers may have different function from each other. Each layer of the organic EL display element, such as the electrode and the organic compound thin film, can be formed of a known material and method.

Among these, the organic EL display element is preferably an organic EL display element having a red organic EL element, a green organic EL element, and a blue organic EL element. In addition, it is preferable that the red organic EL element, the green organic EL element, and the blue organic EL element each have a microcavity structure.

Examples of the organic EL display element as described above include an organic EL display element has, in white display, $\Delta u'v'(60°)$ larger than 0.005, which is represented by Expression (3A), on a CIE 1976 u'v' chromaticity diagram (hereinafter, also referred to as "organic EL display element X").

Expression (3A)

$$\Delta u'v'(60°) = \sqrt{\{(u'(0°, 60°) - u'(180°, 60°))^2 + (v'(0°, 60°))^2 - v'(180°, 60°))^2\}} + $$

$$\sqrt{\{(u'(90°, 60°) - u'(270°, 60°))^2 + (v'(90°, 60°) - v'(270°, 60°))^2\}}$$

In Formula (3A), u'(a°, b°) is a u' value at an azimuthal angle a° and a polar angle b° on a CIE 1976 u'v' chromaticity diagram, and v'(a°, b°) is a v' value at the azimuthal angle a° and the polar angle b° on the CIE 1976 u'v' chromaticity diagram. Provided that, in a case where a display region of the organic EL display device is viewed from the vertical direction, the azimuthal angle refers to an angle that is increased counterclockwise in a case where azimuth from the downward direction toward the upward direction in the plane of the display region is 0°.

For the measurement of the chromaticity, a known chromaticity meter (for example, EZ-Contrast XL88 manufactured by ELDIM, and SR-UL1R manufactured by TOPCON TECHNOHOUSE CORPORATION) can be used.

The fact that the $\Delta u'v'$ (60°) is larger than 0.005 indicates that the tint of the white display varies depending on the azimuthal angle in a case where the organic EL display element is visually recognized from the direction oblique to the front direction.

In a case where the organic EL display element X is used in the organic EL display device according to the embodiment of the present invention, in at least one or more light absorption anisotropic layers, an angle between a transmittance central axis of the light absorption anisotropic layer and a normal line of a layer plane of the light absorption anisotropic layer is preferably 15° or more and 45° or less. By setting the angle to the above-described preferred range, it is easier to further suppress the change in tint when the white display is visually recognized from the oblique direction in a case where the organic EL display element X is used.

In a case of using the organic EL display element X, it is also preferable to use a combination of the light absorption anisotropic layer in which the angle between with the normal line of the layer plane is 10° or more and 45° or less (more preferably 15° or more and 45° or less) and the light absorption anisotropic layer in which the above-described angle is 0° or more and 10° or less (more preferably 0°).

The maximal absorption wavelength of the light absorption anisotropic layer can be adjusted according to the organic EL display element X.

In addition, in each of the above-described aspects, it is also preferable that the polarizer and the polarization control layer, which are described above, are further provided. In this case, in the organic EL display device, it is preferable that the polarizer, the light absorption anisotropic layer, and the polarization control layer are laminated in this order from the visible side.

In addition, examples of the organic EL element include an organic EL display element (hereinafter, also referred to as "organic EL display element Y") that in white display, satisfies a relationship of u'(0°)>u'(30°)>u'(60°) and satisfies a relationship of v'(0°)>v'(30°) and v'(0°)>v'(60°).

Here, u'(c°) is an average value of u' values at all azimuthal angles and the polar angle c° on the CIE 1976 u'v' chromaticity diagram, and v'(c°) is an average value of v' values at all azimuthal angles and the polar angle c° on the CIE 1976 u'v' chromaticity diagram.

The average value of the u' values at the polar angle c° in all azimuth angles is an arithmetic average value of the u' values measured at the polar angle c° while changing the azimuth angle by 5°, and measured in all azimuthal angles.

The average value of the v' values at the polar angle c° in all azimuth angles is an arithmetic average value of the v' values measured at the polar angle c° while changing the azimuth angle by 5°, and measured in all azimuthal angles.

In the measurement of the colorimeter, the above-described chromaticity can be used.

In a case where the relationship regarding the u'(c°) and the v'(c°) is satisfied, the shift generally in the lower left direction on the CIE 1976 u'v' chromaticity diagram is shown as the visually recognized polar angle increases from 0° to 300 and from 300 to 60°. That is, as the visually recognized polar angle increases from 0° to 300 and from 300 to 60°, the tint of the white display changes from generally neutral to blue.

In a case where the organic EL display element Y is used in the organic EL display device according to the embodiment of the present invention, in at least one or more light absorption anisotropic layers, an angle between a transmittance central axis of the light absorption anisotropic layer and a normal line of a layer plane of the light absorption anisotropic layer is preferably 0° or more and 10° or less (more preferably 0°). In addition, the maximal absorption wavelength of the light absorption anisotropic layer is preferably in a range of 460 to 500 nm. By setting the angle and the maximal absorption wavelength each to the above-described preferred ranges, it is easier to further suppress the change in tint when the white display is visually recognized from the oblique direction in a case where the organic EL display element Y is used.

In addition, in each of the above-described aspects, it is also preferable that the polarizer and the polarization control layer, which are described above, are further provided. In this case, in the organic EL display device, it is preferable that the light absorption anisotropic layer, the polarization control layer, and the polarizer are laminated in this order from the visible side.

In addition, examples of the organic EL element include an organic EL display element (hereinafter, also referred to as "organic EL display element Z") that in white display, satisfies a relationship of u'(0°)>u'(30°) and u'(0°)>u'(60°) and satisfies a relationship of v'(0°)>v'(30°) and v'(30°)<v'(60°).

The definitions of u'(c°) and v'(c°) are the same as those described above.

In a case where the relationship regarding the u'(c°) and the v'(c°) is satisfied, the shift generally in the lower left direction on the CIE 1976 u'v' chromaticity diagram is shown as the visually recognized polar angle changes from 0° to 30°. In addition, in a case where the angle changes from 300 to 60°, the shift generally in the upward direction is shown on the CIE1976 u'v' chromaticity diagram. That is, as the visually recognized polar angle changes from 0° to 30°, the tint of the white display changes from generally blue to green, and as the polar angle changes from 300 to 60°, the tint of the white display changes to generally green.

In a case where the organic EL display element Z is used in the organic EL display device according to the embodiment of the present invention, in at least one or more light absorption anisotropic layers, an angle between a transmittance central axis of the light absorption anisotropic layer and a normal line of a layer plane of the light absorption anisotropic layer is preferably 0° or more and 100 or less (more preferably 00). In addition, the maximal absorption wavelength of the light absorption anisotropic layer is preferably in a range of 510 to 570 nm. By setting the angle and the maximal absorption wavelength each to the above-described preferred ranges, it is easier to further suppress the change in tint when the white display is visually recognized from the oblique direction in a case where the organic EL display element Z is used.

In addition, in each of the above-described aspects, it is also preferable that the polarizer and the polarization control layer, which are described above, are further provided. In this case, in the organic EL display device, it is preferable that the light absorption anisotropic layer, the polarization control layer, and the polarizer are laminated in this order from the visible side.

EXAMPLES

Hereinafter, the present invention will be described in detail based on Examples. The materials, reagents, amounts and proportions of substances, operations, and the like described in the following examples can be appropriately modified as long as the gist of the present invention is maintained. Therefore, the present invention is not limited to Examples.

Example 1

[Formation of Alignment Film]

A surface of a cellulose acylate film (TAC base material having a thickness of 40 μm; TG40, FUJIFILM Corporation) was saponified with an alkaline solution and coated with the following composition 1 for forming an alignment film using a wire bar. The support on which the coating film was formed was dried with hot air at 60° C. for 60 seconds, and further dried with hot air at 100° C. for 120 seconds to form an alignment film AL1, thereby obtaining a cellulose acylate film 1 with an alignment film. A film thickness of the alignment film AL1 was 1 μm.

| Formulation of composition 1 for forming an alignment film | |
|---|---|
| Modified polyvinyl alcohol PVA-1 | 3.80 parts by mass |
| IRGACURE 2959 | 0.20 parts by mass |
| Water | 70 parts by mass |
| Methanol | 30 parts by mass |

Modified Polyvinyl Alcohol PVA-1

$$\text{---}(\text{CH}_2\text{---}\text{CH})_{96.8}(\text{CH}_2\text{---}\text{CH})_{1.5}(\text{CH}_2\text{---}\text{CH})_{1.7}$$

with pendant groups OH, OCOCH$_3$, OCONHCH$_2$CH$_2$OCOC(CH$_3$)=CH$_2$

[Formation of Light Absorption Anisotropic Layer P1]

Next, the obtained alignment film AL1 was continuously coated with the following composition P1 for forming a light absorption anisotropic layer using a wire bar, heated at 125° C. for 60 seconds, and cooled to room temperature (23° C.).

Thereafter, the coating layer was irradiated with ultraviolet rays using an LED lamp (center wavelength of 365 nm) for 2 seconds under an irradiation condition of an illuminance of 200 mW/cm$^2$, thereby preparing a light absorption anisotropic layer P1 on the alignment film AL1. A film thickness of the light absorption anisotropic layer P1 was 0.18 μm.

It was confirmed that the high-molecular-weight liquid crystal compound P-1 and the low-molecular-weight liquid crystal compound M-1 were each a liquid crystal compound having a forward wavelength dispersion.

| Formulation of composition P1 for forming light absorption anisotropic layer | |
|---|---|
| Dichroic substance D-1 | 0.15 parts by mass |
| High-molecular-weight liquid crystal compound P-1 | 1.42 parts by mass |
| Low-molecular-weight liquid crystal compound M-1 | 0.32 parts by mass |
| IRGACURE OXE-02 (manufactured by BASF SE) | 0.03 parts by mass |
| Compound E-1 | 0.03 parts by mass |
| Compound E-2 | 0.03 parts by mass |
| Surfactant F-1 | 0.01 parts by mass |
| Cyclopentanone | 88.21 parts by mass |
| Benzyl alcohol | 9.80 parts by mass |

Dichroic Substance D-1

High-Molecular-Weight Liquid Crystal Compound P-1

-continued

Low-Molecular-Weight Liquid Crystal Compound M-1

Compound E-1

30

Compound E-2

Surfactant F-1 shielding layer B1) having a thickness of 0.5 m on the light absorption anisotropic layer P1.

In this manner, an optical film 1 in which the cellulose acylate film, the alignment film AL1, the light absorption anisotropic layer P1, and the oxygen-shielding layer B1 were adjacent to each other in this order was obtained.

[Formation of Oxygen-Shielding Layer B1]

The formed light absorption anisotropic layer P1 was continuously coated with a coating solution having the following formulation (composition B1 for forming an oxygen-shielding layer) using a wire bar. Thereafter, the layer was dried with hot air at 100° C. for 2 minutes, thereby forming a polyvinyl alcohol (PVA) alignment layer (oxygen-

| Formulation of composition B1 for forming oxygen-shielding layer | |
|---|---|
| Modified polyvinyl alcohol described below | 3.80 parts by mass |
| Polymerization initiator IRGACURE 2959 (manufactured by BASF SE) | 0.20 parts by mass |
| Water | 70 parts by mass |
| Methanol | 30 parts by mass |

Modified Polyvinyl Alcohol $$-\left(CH_2-CH\right)_{96.8}\left(CH_2-CH\right)_{1.5}\left(CH_2-CH\right)_{1.7}$$

$$\underset{OH}{|} \quad \underset{OCOCH_3}{|} \quad \underset{OCONHCH_2CH_2OCOC=CH_2}{|} \quad \overset{CH_3}{|}$$

[Preparation of ¼ Film]

The cellulose acylate film was continuously coated with a coating solution PA1 for forming a photo-alignment film having the following formulation using a wire bar. The support on which the coating film was formed was dried with hot air at 140° C. for 120 seconds, and the coating film was irradiated with polarized ultraviolet rays (10 mJ/cm², using an ultra-high pressure mercury lamp) to form a photo-alignment film PA1 having a thickness of 0.2 μm, thereby obtaining a cellulose acylate film with a photo-alignment film.

| Coating solution PA1 for forming photo-alignment film | |
| --- | --- |
| Polymer PA-1 described below | 100.00 parts by mass |
| Acid generator PAG-1 described below | 5.00 parts by mass |
| Acid generator CPI-110TF described below | 0.005 parts by mass |
| Isopropyl alcohol | 16.50 parts by mass |
| Butyl acetate | 1072.00 parts by mass |
| Methyl ethyl ketone | 268.00 parts by mass |

Polymer PA-1

Acid Generator PAG-1

-continued

Acid Generator CPI-110TF

CF₃SO₃⁻

The photo-alignment film PA1 was coated with the composition A-1 having the following formulation using a bar coater. The coating film formed on the photo-alignment film PA1 was heated to 120° C. with hot air, cooled to 60° C., irradiated with ultraviolet rays having a wavelength of 365 nm with an illuminance of 100 mJ/cm² using a high-pressure mercury lamp in a nitrogen atmosphere, and continuously irradiated with ultraviolet rays with an illuminance of 500 mJ/cm² while being heated at 120° C. so that the alignment of the liquid crystal compound was fixed, thereby preparing a cellulose acylate film A1 having a λ/4 retardation layer A1.

A thickness of the λ/4 retardation layer A1 was 2.5 μm, and Re(550) was 144 nm. In addition, the positive A-plate A1 satisfied the relationship of "Re(450)<Re(550)<Re (650)". Re(450)/Re(550) was 0.82.

| Composition A-1 | |
| --- | --- |
| Polymerizable liquid crystal compound LA-1 described below | 43.50 parts by mass |
| Polymerizable liquid crystal compound LA-2 described below | 43.50 parts by mass |
| Polymerizable liquid crystal compound LA-3 described below | 8.00 parts by mass |
| Polymerizable liquid crystal compound LA-4 described below | 5.00 parts by mass |
| Polymerization initiator PI-1 described below | 0.55 parts by mass |
| Leveling agent T-1 described below | 0.20 parts by mass |
| Cyclopentanone | 235.00 parts by mass |

Polymerizable Liquid Crystal Compound LA-1 (tBu Represents a Tertiary Butyl Group)

Polymerizable Liquid Crystal Compound LA-2

Polymerizable Liquid Crystal Compound LA-3

Polymerizable Liquid Crystal Compound LA-4 (Me Represents a Methyl Group)

Polymerization Initiator PI-1

Leveling Agent T-1

[Preparation of Polarizing Plate C1]

A polarizing plate 1 in which a thickness of a polarizer was 8 μm, one surface of the polarizer was exposed, and the other surface was protected with a protective film, was produced by the same method as that for a polarizing plate 02 with a one-surface protective film, described in WO2015/166991A.

The optical film A1 was bonded to both surfaces of the polarizing plate 1, which are the surface on which the polarizer was exposed and the surface on the protective film side, with a commercially available pressure-sensitive adhesive (manufactured by Soken Chemical & Engineering Co., Ltd., SK2057) such that the retardation layer side of the optical film A1 including the λ/4 retardation layer faced each surface. Furthermore, the optical film 1 was bonded to the optical film A1 bonded to the surface on which the polarizer was exposed, with a commercially available pressure-sensitive adhesive (manufactured by Soken Chemical & Engineering Co., Ltd., SK2057) such that the oxygen-shielding layer B1 side of the optical film 1 including the light absorption anisotropic layer prepared by the above-described procedure was on the optical film A1 side, to obtain the polarizing plate C1.

[Preparation of Organic EL Display Device 1]

Apple Watch Series 6 (manufactured by Apple Inc.) equipped with an organic EL panel (organic EL display device) was disassembled, and the organic EL display device was taken out. Subsequently, the circularly polarizing plate was peeled off from the organic EL display device to take out the organic EL display element. The polarizing plate C1 prepared by the above-described procedure was bonded to the organic EL display element using a commercially available pressure-sensitive adhesive (manufactured by Soken Chemical & Engineering Co., Ltd., SK2057) such that the light absorption anisotropic layer was on the visible side, instead of the peeled circularly polarizing plate. An organic EL display device 1 used in Example 1 was prepared by the above-described procedure.

Example 2

[Formation of Light Absorption Anisotropic Layer P2-1]

The optical film 2-1 was prepared in the same manner as in the light absorption anisotropic layer P1, except that, in the preparation of the light absorption anisotropic layer P1, the coating amount was adjusted such that the film thickness of the light absorption anisotropic layer is 0.2 μm, and after the coating, the light absorption anisotropic layer was heated at 125° C. for 60 seconds, then cooled to room temperature (23° C.), subsequently heated at 85° C. for 60 seconds, and cooled to room temperature again.

[Formation of Light Absorption Anisotropic Layer P2-2]

A light absorption anisotropic layer in which the coloring agent was tilt-aligned was prepared as follows.

(Preparation of Transparent Support 1 with Second Alignment Layer)

A surface of a cellulose acylate film (TAC base material with a thickness of 40 m; TG40 manufactured by FUJIFILM Corporation) was saponified with an alkaline solution, and coated with the following composition 1 for forming an alignment film using a wire bar. The support on which the coating film had been formed was dried with hot air at 60° C. for 60 seconds and further dried with hot air at 100° C. for 120 seconds to form the second alignment layer 1, thereby obtaining a cellulose acylate film with an alignment layer. The film thickness of the second alignment layer 1 was 0.5 μm.

Furthermore, the prepared cellulose acylate film with a second alignment layer was subjected to a rubbing treatment on the surface of the alignment film layer.

(Preparation of First Alignment Layer)

The composition 1 for forming a first alignment layer having the following formulation was applied onto the second alignment film of the prepared cellulose acylate film with a second alignment layer using a wire bar, to prepare a first coating layer T1.

Next, the first coating layer T1 was heated at 120° C. for 30 seconds, and the coating layer T1 was cooled to room temperature (23° C.). The coating layer was further heated at 80° C. for 60 seconds and cooled to room temperature again.

Thereafter, the coating layer was irradiated with ultraviolet rays using an LED lamp (central wavelength of 365 nm) for 1 second under an irradiation condition of an illuminance of 200 mW/cm², thereby preparing a first alignment layer T1 on the second alignment layer 1.

A film thickness of the first alignment layer T1 was 0.64 μm.

| Formulation of composition T1 for forming first alignment layer | |
|---|---|
| High-molecular-weight liquid crystal compound P-1 described above | 55.20 parts by mass |
| Low-molecular-weight liquid crystal compound M-1 described above | 40.49 parts by mass |
| Polymerization initiator IRGACURE OXE 02 (manufactured by BASF SE) | 4.049 parts by mass |
| Surfactant F-1 described above | 0.2620 parts by mass |
| Cyclopentanone | 660.6 parts by mass |
| Tetrahydrofuran | 660.6 parts by mass |

[Formation of Light Absorption Anisotropic Layer P2-2]

The following composition P2 for forming a light absorption anisotropic layer was continuously applied to the obtained alignment film T1 using a wire bar, heated at 150° C. for 60 seconds, and then cooled to room temperature (23° C.), subsequently heated at 75° C. for 60 seconds, and cooled to room temperature again.

Thereafter, the coating layer was irradiated with ultraviolet rays using an LED lamp (center wavelength of 365 nm) for 2 seconds under an irradiation condition of an illuminance of 200 mW/cm², thereby preparing a light absorption anisotropic layer P2-2 on the alignment film T1.

A film thickness of the light absorption anisotropic layer P2-2 was 0.4 μm. Subsequently, in the same manner as in Example 1, an oxygen-shielding layer B1 was formed on the light absorption anisotropic layer P2-2, thereby preparing an optical film 2-2.

| Formulation of composition P2 for forming light absorption anisotropic layer | |
| --- | --- |
| Dichroic substance D-2 | 0.51 parts by mass |
| High-molecular-weight liquid crystal compound P-1 described above | 6.73 parts by mass |
| IRGACURE OXE-02 (manufactured by BASF SE) | 0.23 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Dichroic substance D-2

<Preparation of Polarizing Plate C2≥

First, a polarizing plate 1 used in Example 1 was prepared in the same manner as in Example 1.

The optical film A1 was bonded to the polarizing plate 1 with a commercially available pressure-sensitive adhesive (manufactured by Soken Chemical & Engineering Co., Ltd., SK2057) such that the surface on the protective film side of the polarizing plate 1 faced to the surface on the retardation layer side of the optical film A1 including the λ/4 retardation layer. Furthermore, the optical film 2-1 was bonded to the surface on which the polarizer was exposed, with a commercially available pressure-sensitive adhesive (manufactured by Soken Chemical & Engineering Co., Ltd., SK2057) such that the oxygen-shielding layer B1 side of the optical film 2-1 including the light absorption anisotropic layer prepared by the above-described procedure was on the optical film A1 side. Subsequently, the optical film 2-2 and the optical film 2-1 were bonded to each other with a commercially available pressure-sensitive adhesive (manufactured by Soken Chemical & Engineering Co., Ltd., SK2057) such that the oxygen-shielding layer B1 side of the optical film 2-2 including the light absorption anisotropic layer prepared above was on the optical film A1 side, to obtain a polarizing plate C2.

respect to the azimuth from the downward direction toward the upward direction in the plane of the organic EL display device.

Example 3

[Preparation of Optical Film 3]

An optical film 3 including a light absorption anisotropic layer P3 was prepared in the same manner as in the preparation of the optical film 1, except that, in the preparation of the optical film 1 of Example 1, the composition P1 for forming a light absorption anisotropic layer was changed to a composition P3 for forming a light absorption anisotropic layer, the coating amount was adjusted such that the film thickness of the light absorption anisotropic layer is 0.5 m, and after the coating, the light absorption anisotropic layer was heated at 150° C. for 60 seconds, then cooled to room temperature (23° C.), subsequently heated at 75° C. for 60 seconds, and cooled to room temperature again.

| Formulation of composition P3 for forming light absorption anisotropic layer | |
| --- | --- |
| Dichroic substance D-3 | 0.51 parts by mass |
| High-molecular-weight liquid crystal compound P-1 described above | 6.73 parts by mass |
| IRGACURE OXE-02 (manufactured by BASF SE) | 0.23 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Dichroic substance D-3

<Preparation of Organic EL Display Device 2≥

An organic EL display device 2 used in Example 2 was prepared in the same manner as in Example 1, except that, the polarizing plate C1 was changed to a polarizing plate C2 in the preparation of a organic EL display device 1. Provided that the polarizing plate C2 was bonded to the organic EL display device such that the azimuthal angle direction of the transmittance central axis of the optical film 2-2 was 0° with

[Preparation of Organic EL Display Device 3]

An organic EL display device 3 was prepared in the same manner as in Example 1, except that in the preparation of the organic EL display device 1, the Apple Watch Series 6 manufactured by Apple Inc. was changed to iPhone (registered trademark) 12 Pro manufactured by Apple Inc., and the optical film 3 was used.

Example 4

An organic EL display device 4 was prepared by the same procedure as in Example 3, except that, in the preparation of the optical film 3 of Example 3, the composition P3 for forming a light absorption anisotropic layer was changed to a composition P4 for forming a light absorption anisotropic layer. The light absorption anisotropic layer contained in the optical film 4 prepared in Example 4 is also referred to as a light absorption anisotropic layer P4.

| Formulation of composition P4 for forming light absorption anisotropic layer | |
| --- | --- |
| Dichroic substance D-2 described above | 0.37 parts by mass |
| Dichroic substance D-4 | 0.37 parts by mass |
| High-molecular-weight liquid crystal compound P-1 described above | 6.51 parts by mass |
| IRGACURE OXE-02 (manufactured by BASF SE) | 0.22 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Dichroic substance D-4

Example 5

[Preparation of Optical Film 5]

An optical film 5 including a light absorption anisotropic layer P5 was prepared by the same procedure as in Example 3, except that, in the preparation of the optical film 3 of Example 3, the composition P3 for forming a light absorption anisotropic layer was changed to a composition P5 for forming a light absorption anisotropic layer, and the coating amount was adjusted such that the film thickness of the light absorption anisotropic layer was 0.3 μm.

| Formulation of composition P5 for forming light absorption anisotropic layer | |
| --- | --- |
| Dichroic substance D-2 described above | 0.49 parts by mass |
| Dichroic substance D-1 shown above | 0.25 parts by mass |
| High-molecular-weight liquid crystal compound P-1 described above | 6.51 parts by mass |
| IRGACURE OXE-02 (manufactured by BASF SE) | 0.22 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

[Preparation of Organic EL Display Device 5]

An organic EL display device 5 was prepared in the same manner as in Example 1, except that in the preparation of the organic EL display device 1, the Apple Watch Series 6 manufactured by Apple Inc. was changed to iPhone (registered trademark) 12 manufactured by Apple Inc., and the optical film 5 was used.

Example 6

An optical film 6 including the light absorption anisotropic layer P6 was prepared in the same manner as in Example 1, except that, in the preparation of the optical film 1 of Example 1, the film was heated at 125° C. for 60 seconds, then cooled to room temperature (23° C.), subsequently heated at 85° C. for 60 seconds, and cooled to room temperature again. An organic EL display device 6 was prepared by the same procedure as in Example 1, except that the prepared optical film 6 was used instead of the optical film 1.

Example 7

An organic EL display device 7 was prepared by the same procedure as in Example 4, except that, in the formation of the light absorption anisotropic layer of Example 4, the composition P4 for forming a light absorption anisotropic layer was changed to a composition P7 for forming a light absorption anisotropic layer. The light absorption anisotropic layer contained in the optical film 7 prepared in Example 7 is also referred to as a light absorption anisotropic layer P7.

| Formulation of composition P7 for forming light absorption anisotropic layer | |
| --- | --- |
| Dichroic substance D-2 described above | 0.40 parts by mass |
| Dichroic substance D-5 | 0.34 parts by mass |
| High-molecular-weight liquid crystal compound P-1 described above | 6.51 parts by mass |
| IRGACURE OXE-02 (manufactured by BASF SE) | 0.22 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Dichroic Substance D-5

Example 8

An optical film 8 including a light absorption anisotropic layer P8 was prepared by the same procedure as in Example 5, except that, in the preparation of the optical film 5 of Example 5, the composition P5 for forming a light absorption anisotropic layer was changed to a composition P8 for forming a light absorption anisotropic layer. An organic EL display device 8 was prepared by the same procedure as in Example 5, except that the prepared optical film 8 was used instead of the optical film 5.

| Formulation of composition P8 for forming light absorption anisotropic layer | |
| --- | --- |
| Dichroic substance D-2 described above | 0.51 parts by mass |
| High-molecular-weight liquid crystal compound P-1 described above | 6.74 parts by mass |
| IRGACURE OXE-02 (manufactured by BASF SE) | 0.22 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Example 9

[Preparation of Optical Film 9]

An optical film 9 including a light absorption anisotropic layer P9 was prepared in the same manner as in Example 6, except that, in the preparation of the optical film 6 of Example 6, the coating amount was adjusted such that the film thickness of the light absorption anisotropic film was 0.35 μm.

[Preparation of Organic EL Display Device 9]

An organic EL display device 9 was prepared in the same manner as in Example 8, except that the optical film 8 was changed to an optical film 9 in the preparation of the organic EL display device 8.

Example 10

An organic EL display device 10 was prepared in the same manner as in Example 7, except that the optical film A1 ($\lambda/4$ film) attached to the visible side was changed to COSMOS-HINE super birefringence type (SRF, manufactured by Toyobo Co., Ltd.) (depolarization film) in Example 7.

Example 11

[Formation of Light Absorption Anisotropic Layer P11]

In the Preparation of the light absorption anisotropic layer P2-2, the composition P2 for forming a light absorption anisotropic layer was changed to the composition P11 for forming a light absorption anisotropic layer, the coating amount was adjusted such that the film thickness of the light absorption anisotropic layer was 0.2 μm, and the composition was applied onto the first alignment film. In this case, the thickness of the first alignment film was adjusted to be thick such that the transmittance central axis of the light absorption anisotropic film was 10°. An optical film 11 including the light absorption anisotropic layer P11 was prepared in the same manner as in the light absorption anisotropic layer P2-2, except that, after the coating, the coating liquid was heated at 125° C. for 60 seconds, then cooled to room temperature (23° C.), subsequently heated at 85° C. for 60 seconds, and cooled to room temperature again.

| Formulation of composition P11 for forming light absorption anisotropic layer | |
| --- | --- |
| Dichroic substance D-5 described above | 0.18 parts by mass |
| High-molecular-weight liquid crystal compound P-1 described above | 1.39 parts by mass |
| Low-molecular-weight liquid crystal compound M-1 described above | 0.32 parts by mass |
| IRGACURE OXE-02 (manufactured by BASF SE) | 0.03 parts by mass |
| Compound E-1 described above | 0.03 parts by mass |
| Compound E-2 described above | 0.03 parts by mass |
| Surfactant F-1 described above | 0.01 parts by mass |
| Cyclopentanone | 88.22 parts by mass |
| Benzyl alcohol | 9.80 parts by mass |

[Preparation of Organic EL Display Device 11]

An organic EL display device 11 was prepared in the same manner as in Example 6, except that, in the preparation of the organic EL display device 6, the optical film 6 was changed to an optical film 9 and the optical film 11 was bonded onto the optical film 9 with a commercially available pressure-sensitive adhesive (manufactured by Soken Chemical & Engineering Co., Ltd., SK2057). Provided that the optical film 11 was bonded to the organic EL display device such that the azimuthal angle direction of the transmittance central axis of the optical film 11 was 1800 with respect to the azimuth from the downward direction toward the upward direction in the plane of the organic EL display device.

Example 12

An organic EL display device 12 was prepared in the same manner as in Example 11, except that, in the preparation of the organic EL display device 11 of Example 11, the optical film 9 was changed to an optical film 2-1 and the optical film 11 was changed to an optical film 2-2. Provided that the optical film 2-2 was bonded to the organic EL display device such that the azimuthal angle direction of the transmittance central axis of the optical film 2-2 was 0° with respect to the azimuth from the downward direction toward the upward direction in the plane of the organic EL display device.

Example 13

An organic EL display device 13 was prepared in the same manner as in Example 2, except that, in preparation of the organic EL display device 2 of Example 2, the optical film A1 was bonded onto the optical film P2-2.

Example 14

[Formation of Light Absorption Anisotropic Layer P14]

An optical film 14 having a light absorption anisotropic layer P14 was prepared in the same manner as in Example 1, except that in the preparation of the optical film 1 of Example 1, the composition P1 for forming a light absorption anisotropic layer was changed to a composition P14 for forming a light absorption anisotropic layer, the coating amount was adjusted such that the film thickness of the light absorption anisotropic film is 1 µm, and after the coating, the light absorption anisotropic layer was heated at 150° C. for 60 seconds, then cooled to room temperature (23° C.), subsequently heated at 70° C. for 60 seconds, and cooled to room temperature again.

| Formulation of composition P14 for forming light absorption anisotropic layer | |
| --- | --- |
| Dichroic substance D-2 described above | 0.40 parts by mass |
| Dichroic substance D-5 described above | 0.68 parts by mass |
| High-molecular-weight liquid crystal compound P-1 described above | 6.60 parts by mass |
| IRGACURE OXE-02 (manufactured by BASF SE) | 0.12 parts by mass |
| Compound E-1 described above | 0.09 parts by mass |
| Compound E-2 described above | 0.09 parts by mass |
| Surfactant F-1 described above | 0.02 parts by mass |
| Cyclopentanone | 82.80 parts by mass |
| Benzyl alcohol | 9.20 parts by mass |

[Preparation of Organic EL Display Device 14]

The optical film 14 created above was bonded onto a display screen of Galaxy Z fold3 5G (commercially available organic EL display device not including a polarizing plate) manufactured by Samsung Electronics Co., Ltd., on which an organic EL panel (organic EL display element) was mounted, using a commercially available pressure-sensitive adhesive (manufactured by Soken Chemical & Engineering Co., Ltd., SK2057), thereby preparing an organic EL display device 14.

Example 15

An organic EL display device 15 was prepared in the same manner as in Example 14, except that, in Example 14, the composition P14 for forming a light absorption anisotropic layer was changed to a composition P15 for forming a light absorption anisotropic layer.

| Formulation of composition P15 for forming light absorption anisotropic layer | |
| --- | --- |
| Dichroic substance D-2 described above | 0.24 parts by mass |
| Dichroic substance D-5 described above | 0.24 parts by mass |
| High-molecular-weight liquid crystal compound P-1 described above | 7.20 parts by mass |
| IRGACURE OXE-02 (manufactured by BASF SE) | 0.12 parts by mass |
| Compound E-1 described above | 0.09 parts by mass |
| Compound E-2 described above | 0.09 parts by mass |
| Surfactant F-1 described above | 0.02 parts by mass |
| Cyclopentanone | 82.80 parts by mass |
| Benzyl alcohol | 9.20 parts by mass |

Example 16

An organic EL display device 16 was prepared in the same manner as in Example 7, except that, in Example 7, the composition P7 for forming a light absorption anisotropic layer was changed to a composition P16 for forming a light absorption anisotropic layer.

| Formulation of composition P15 for forming light absorption anisotropic layer | |
| --- | --- |
| Dichroic substance D-2 described above | 0.80 parts by mass |
| Dichroic substance D-5 | 0.68 parts by mass |
| High-molecular-weight liquid crystal compound P-1 described above | 5.77 parts by mass |
| IRGACURE OXE-02 (manufactured by BASF SE) | 0.22 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Example 17

An organic EL display device 17 was prepared in the same manner as in Example 6, except that, in Example 6, the composition P1 for forming a light absorption anisotropic layer was changed to a composition P17 for forming a light absorption anisotropic layer.

It was confirmed that the low-molecular-weight liquid crystal compound M-2 and the low-molecular-weight liquid crystal compound M-3 were each a liquid crystal compound having a forward wavelength dispersion.

| Formulation of composition P17 for forming light absorption anisotropic layer | |
| --- | --- |
| Dichroic substance D-6 described below | 0.15 parts by mass |
| Low-molecular-weight liquid crystal compound M-2 described below | 1.08 parts by mass |
| Low-molecular-weight liquid crystal compound M-3 described below | 0.66 parts by mass |
| IRGACURE OXE-02 (manufactured by BASF SE) | 0.03 parts by mass |
| Compound E-1 | 0.03 parts by mass |
| Compound E-2 | 0.03 parts by mass |
| Surfactant F-1 | 0.01 parts by mass |
| Cyclopentanone | 88.21 parts by mass |
| Benzyl alcohol | 9.80 parts by mass |

Dichroic Substance D-6

Low-Molecular-Weight Liquid Crystal Compound M-2

Low-Molecular-Weight Liquid Crystal Compound M-3

Example 18

An organic EL display device 18 was produced in the same manner as in Example 3, except that, in Example 3, the composition P3 for forming a light absorption anisotropic layer was changed to a composition P18 for forming a light absorption anisotropic layer.

| Formulation of composition P18 for forming light absorption anisotropic layer | |
| --- | --- |
| Dichroic substance D-7 described below | 0.51 parts by mass |
| Low-molecular-weight liquid crystal compound M-2 described above | 4.19 parts by mass |
| Low-molecular-weight liquid crystal compound M-3 described above | 2.54 parts by mass |
| IRGACURE OXE-02 (manufactured by BASF SE) | 0.23 parts by mass |
| Compound E-1 described above | 0.09 parts by mass |
| Compound E-2 described above | 0.09 parts by mass |
| Surfactant F-1 described above | 0.05 parts by mass |
| Cyclopentanone | 83.07 parts by mass |
| Benzyl alcohol | 9.23 parts by mass |

Dichroic Substance D-7

Comparative Example 1

An organic EL display device B1 was prepared in the same manner as in Example 1, except that the bonding of the optical film 1 was not performed in the preparation of the organic EL display device 1 of Example 1.

Comparative Example 2

An organic EL display device B2 was prepared in the same manner as in Comparative Example 1, except that in Comparative Example 1, the Apple Watch Series 6 manufactured by Apple Inc. was changed to iPhone (registered trademark) 12 manufactured by Apple Inc.

Comparative Example 3

An organic EL display device B3 was prepared in the same manner as in Comparative Example 1, except that in Comparative Example 1, the Apple Watch Series 6 manufactured by Apple Inc. was changed to iPhone (registered trademark) 12 Pro manufactured by Apple Inc.

Comparative Example 4

An organic EL display device B4 was prepared in the same manner as in Example 1, except that, in the preparation of the optical film 1 of Example 1, the coating amount was adjusted such that the film thickness of the light absorption anisotropic layer was 0.03 μm. The light absorption aniso-tropic layer contained in the optical film B4 prepared in Comparative Example 4 is also referred to as a light absorption anisotropic layer PB4.

Comparative Example 5

An organic EL display device B5 was prepared in the same manner as in Example 1, except that, in the preparation of the optical film 1 of Example 1, the coating amount was adjusted such that the film thickness of the light absorption anisotropic layer was 0.8 μm. The light absorption anisotropic layer contained in the optical film B5 prepared in Comparative Example 5 is also referred to as a light absorption anisotropic layer PB5.

Comparative Example 6

An organic EL display device B6 was prepared in the same manner as in Comparative Example 6, except that, in Comparative Example 6, the composition P1 for forming a light absorption anisotropic layer was changed to a composition PB6 for forming a light absorption anisotropic layer, and the film thickness of the light absorption anisotropic film was adjusted to be 1.6 μm. The light absorption anisotropic layer contained in the optical film B6 prepared in Comparative Example 6 is also referred to as a light absorption anisotropic layer PB6.

| Formulation of composition PB6 for forming light absorption anisotropic layer | |
| --- | --- |
| Dichroic substance D-1 described above | 0.15 parts by mass |
| High-molecular-weight liquid crystal compound P-1 described above | 2.84 parts by mass |
| Low-molecular-weight liquid crystal compound M-1 described above | 0.64 parts by mass |
| IRGACURE OXE-02 (manufactured by BASF SE) | 0.03 parts by mass |
| Compound E-1 described above | 0.03 parts by mass |
| Compound E-2 described above | 0.03 parts by mass |
| Surfactant F-1 described above | 0.01 parts by mass |
| Cyclopentanone | 86.64 parts by mass |
| Benzyl alcohol | 9.63 parts by mass |

<Measurement and Evaluation>

The results of the measurement and the evaluation performed on the optical film and the organic EL display device prepared in Examples and Comparative Examples are shown in the following tables.

[Measurement of optical properties]

(1) Measurement of Maximal Absorption Wavelength

The Mueller matrix of the obtained light absorption anisotropic layer was measured in a wavelength range of 400 to 750 nm at intervals of 10 nm in a polar angle direction of 30° in four azimuths of azimuth 0°, 90°, 180°, and 2700 using AxoScan OPMF-1 (manufactured by Opto Science, Inc.), and a maximal absorption wavelength was obtained from the average value of the four azimuths.

(2) Transmittance Central Axis and Rth

The Mueller matrix of the obtained light absorption anisotropic layer at a maximal absorption wavelength was measured at the polar angle in the range of −70° to 700 at intervals of 5° using AxoScan OPMF-1 (manufactured by Opto Science, Inc.). From this measurement result, a transmittance central axis angle θ at which the transmittance was maximal, and Rth were obtained. In the calculation of Rth, an assumed value of the average refractive index of 1.60 and the film thickness were input. In a case where there are a plurality of maximal absorption wavelengths, for the transmittance central axis angle, the average value of the transmittance central axis angles at the maximal absorption wavelengths was defined as the transmittance central axis angle θ.

(3) Absorption Anisotropy A(λ) and B(λ)

In order to specify the absorption anisotropy of the light absorption anisotropic layer, the polarization properties of each obtained optical film were obtained by measurement with changing the polar angle direction in the in-plane slow axis direction of the optical film.

Specifically, the Mueller matrix was measured at the maximal absorption wavelength λ at the polar angle in the in-plane slow axis direction in a range of −70° to 700 at intervals of 5° using Axoscan of Axometrics, Inc. as the measurement device, and kx(λ), ky(λ), and kz(λ) were obtained by fitting. Subsequently, the absorption anisotropy A(λ) and B(λ) were obtained according to Expression (1) and Expression (2) described above.

In addition, in the same manner, the value $(A_{min})$ of the smallest A(λ) of the light absorption anisotropic layer at a wavelength of 400 to 650 nm was obtained, and the wavelength $λ_{min}$ at which the value $(A_{min})$ was taken was also obtained.

[Evaluation of Display Performance]

The produced organic EL display device was evaluated for visibility of white display and display product quality under bright light based on the following standard. In practice, the evaluation of A+ to E is preferable. The evaluation results are shown in Tables 1 to 3 below.

(Evaluation Standard of White Display Performance)

A+: In a state of being viewed with the naked eye and in a state of wearing the polarized sunglasses, the change in tint is considerably small in a case where an azimuthal angle and a polar angle are changed, and the change in tint is not noticeable.

A: In a state of being viewed with the naked eye and in a state of wearing the polarized sunglasses, the change in tint is small in a case where an azimuthal angle and a polar angle are changed, and the change in tint is hardly noticeable.

B: In a state of being viewed with the naked eye and in a state of wearing the polarized sunglasses, the change in tint is slightly exhibited in a case where an azimuthal angle is changed, but the change in tint is small in a case where a polar angle is changed, and the change in tint is not very noticeable.

C: In a state of being viewed with the naked eye and in a state of wearing the polarized sunglasses, the change in tint is exhibited in a case where an azimuthal angle is changed, but the change is within the same hue, the change in tint is small also in a case where a polar angle is changed, and the change in tint is not very noticeable.

D: In a state of being viewed with the naked eye and in a state of wearing the polarized sunglasses, the change in tint was not noticeable, but a slight darkness was entirely felt from any angle.

E: The change in tint is not noticeable in a state of being viewed with the naked eye, but in a state of wearing the polarized sunglasses, the change in tint or the darkness is noticeable depending on the viewing direction.

F: In a state of being viewed with the naked eye and even in a state of wearing the polarized sunglasses, the change in tint is not noticeable in a case where an azimuthal angle is changed, but the change in tint is large in a case where a polar angle is changed, and the change in tint is noticeable.

G: In a state of being viewed with the naked eye and even in a state of wearing the polarized sunglasses, the change in tint is large in a case where an azimuthal angle and a polar angle are changed, and the change in tint is noticeable.

<Result>

The measurement results and evaluation results are shown in Tables 1 to 4 below.

In the tables, in a case where a product of Apple Watch Series 6 manufactured by Apple Inc. is used as the organic EL display element, it is described as "OLED1". In addition, in the tables, in a case where a product of iPhone (registered trademark) 12 Pro manufactured by Apple Inc. is used as the organic EL display element, it is described as "OLED2". In addition, in the tables, in a case where a product of iPhone (registered trademark) 12 manufactured by Apple Inc. is used as the organic EL display element, it is described as "OLED3". Furthermore, in the tables, in a case where a product of Galaxy Z fold3 5G manufactured by Samsung Electronics Co., Ltd., is used as the organic EL display element, it is described as "OLED4".

In addition, "OLED1" in the tables corresponds to the above-described organic EL display element X, "OLED2" corresponds to the above-described organic EL display element Y, and "OLED3" corresponds to the above-described organic EL display element Z.

In the tables, the $\lambda/4$ retardation film is described as "$\lambda/4$ plate".

In the tables, each light absorption anisotropic layer contained in each optical film is described by the reference numeral of each light absorption anisotropic layer. For example, the light absorption anisotropic layer P1 is referred to as "P1".

In the tables, the column of $A_{min}$ indicates the smallest value of $A(\lambda)$ in the wavelength of 400 to 650 nm of the light absorption anisotropic layer. In addition, the column of $\lambda_{min}$ indicates the wavelength at which the smallest value of $A(\lambda)$ is shown.

In the tables, the column of $A(\lambda_{min})/A(\lambda_{max})$ indicates a ratio of the smallest value of $A(\lambda)$ of the light absorption anisotropic layer at a wavelength of 400 to 650 nm to the value of $A(\lambda)$ at the maximal absorption wavelength of the light absorption anisotropic layer.

TABLE 1

| | | | Example 1 | Example 2 | Example 3 | Example 4 | Example 5 | Example 6 |
|---|---|---|---|---|---|---|---|---|
| Organic EL display device | | | 1 | 2 | 3 | 4 | 5 | 6 |
| Configuration | | | P1 | P2-2 | P3 | P4 | P5 | P6 |
| | | | $\lambda/4$ plate | P2-1 | $\lambda/4$ plate | $\lambda/4$ plate | $\lambda/4$ plate | $\lambda/4$ plate |
| | | | Polarizer | Polarizer | Polarizer | Polarizer | Polarizer | Polarizer |
| | | | $\lambda/4$ plate | $\lambda/4$ plate | $\lambda/4$ plate | $\lambda/4$ plate | $\lambda/4$ plate | $\lambda/4$ plate |
| | | | OLED1 | OLED1 | OLED2 | OLED2 | OLED3 | OLED1 |
| Maximal absorption wavelength 1 [nm] | | | 580 | 510 | 480 | 500 | 560 | 580 |
| Maximal absorption wavelength 2 [nm] | | | — | 580 | — | — | — | — |
| Light absorption anisotropic layer (display element side) | | $\theta[°]$ | 0 | 0 | 0 | 0 | 0 | 0 |
| | Maximal absorption wavelength 1 | $Rth(\lambda)[nm]$ | −23 | −6 | −46 | −112 | −82 | −25 |
| | | $A(\lambda)[nm]$ | 55 | 18 | 76 | 83 | 24 | 57 |
| | | $B(\lambda)[—]$ | 28 | 100 | 13 | 22 | 25 | 148 |
| | Maximal absorption wavelength 2 | $Rth(\lambda)[nm]$ | — | −28 | — | — | — | — |
| | | $A(\lambda)[nm]$ | — | 65 | — | — | — | — |
| | | $B(\lambda)[—]$ | — | 148 | — | — | — | — |
| | $A_{min}[nm]$ | | 2 | 3 | 0 | 0 | 6 | 2 |
| | $\lambda_{min}[nm]$ | | 400 | 400 | 650 | 650 | 400 | 400 |
| | $A(\lambda_{min})/A(\lambda_{max})$ | | 0.04 | 0.05 | 0 | 0 | 0.25 | 0.04 |
| Light absorption anisotropic layer (visible side) | | $\theta[°]$ | — | 30 | — | — | — | — |
| | Maximal absorption wavelength 1 | $Rth(\lambda)[nm]$ | — | −19 | — | — | — | — |
| | | $A(\lambda)[nm]$ | — | 12 | — | — | — | — |
| | | $B(\lambda)[—]$ | — | 28 | — | — | — | — |
| | Maximal absorption wavelength 2 | $Rth(\lambda)[nm]$ | — | −21 | — | — | — | — |
| | | $A(\lambda)[nm]$ | — | 9 | — | — | — | — |
| | | $B(\lambda)[—]$ | — | 28 | — | — | — | — |
| | $A_{min}[nm]$ | | — | 0 | — | — | — | — |
| | $\lambda_{min}[nm]$ | | | 650 | | | | |
| | $A(\lambda_{min})/A(\lambda_{max})$ | | — | 0 | — | — | — | — |
| Total | Maximal absorption wavelength 1 | $Rth(\lambda)[nm]$ | −23 | −25 | −46 | −112 | −82 | −25 |
| | | $A(\lambda)[nm]$ | 55 | 30 | 76 | 83 | 24 | 57 |
| | | $B(\lambda)[—]$ | 28 | 71 | 13 | 22 | 25 | 148 |
| | Maximal absorption wavelength 2 | $Rth(\lambda)[nm]$ | — | −49 | — | — | — | — |
| | | $A(\lambda)[nm]$ | — | 74 | — | — | — | — |
| | | $B(\lambda)[—]$ | — | 133 | — | — | — | — |
| Display performance evaluation | | | D | E | D | D | D | C |

TABLE 2

| | | Example 7 | Example 8 | Example 9 | Example 10 | Example 11 | Example 12 | Example 13 | Example 14 |
|---|---|---|---|---|---|---|---|---|---|
| Organic EL display device | | 7 | 8 | 9 | 10 | 11 | 12 | 13 | 14 |
| Configuration | | — | — | — | — | P11 | P2-2 | $\lambda/4$ plate | — |
| | | P7 | P8 | P9 | P7 | P9 | P2-1 | P2-2 | — |
| | | $\lambda/4$ plate | $\lambda/4$ plate | $\lambda/4$ plate | Depolar- ization layer | $\lambda/4$ plate | $\lambda/4$ plate | P2-1 | — |

TABLE 2-continued

| | | Example 7 | Example 8 | Example 9 | Example 10 | Example 11 | Example 12 | Example 13 | Example 14 |
|---|---|---|---|---|---|---|---|---|---|
| | | Polarizer λ/4 plate OLED2 | Polarizer λ/4 plate OLED3 | Polarizer λ/4 plate OLED3 | Polarizer λ/4 plate OLED2 | Polarizer λ/4 plate OLED1 | Polarizer λ/4 plate OLED1 | Polarizer λ/4 plate OLED1 | — P14 OLED4 |
| Maximal absorption wavelength 1 [nm] | | 490 | 510 | 580 | 490 | 420 | 510 | 510 | 430 |
| Maximal absorption wavelength 2 [nm] | | — | — | — | — | 580 | 580 | 580 | — |
| Light absorption anisotropic layer (display element side) | θ[°] | 0 | 0 | 0 | 0 | 0 | 0 | 0 | 0 |
| | Maximal absorption wavelength 1   Rth(λ)[nm] | −177 | −54 | −50 | −177 | −30 | −6 | −6 | −130 |
| | A(λ)[nm] | 104 | 46 | 114 | 104 | 11 | 18 | 18 | 160 |
| | B(λ)[—] | 37 | 40 | 148 | 37 | 18 | 100 | 100 | 70 |
| | Maximal absorption wavelength 2   Rth(λ)[nm] | — | — | — | — | −50 | −28 | −28 | — |
| | A(λ)[nm] | — | — | — | — | 114 | 65 | 65 | — |
| | B(λ)[—] | — | — | — | — | 148 | 148 | 148 | — |
| | $A_{min}$[nm] | 0 | 0 | 4 | 0 | 4 | 3 | 3 | 0 |
| | $\lambda_{min}$[nm] | 650 | 650 | 400 | 650 | 400 | 400 | 400 | 650 |
| | $A(\lambda_{min})/A(\lambda_{max})$ | 0 | 0 | 0.04 | 0 | 0.04 | 0.05 | 0.05 | 0 |
| Light absorption anisotropic layer (visible side) | θ[°] | — | — | — | — | 10 | 30 | 30 | — |
| | Maximal absorption wavelength 1   Rth(λ)[nm] | — | — | — | — | −28 | −19 | −19 | — |
| | A(λ)[nm] | — | — | — | — | 27 | 12 | 12 | — |
| | B(λ)[—] | — | — | — | — | 55 | 28 | 28 | — |
| | Maximal absorption wavelength 2   Rth(λ)[nm] | — | — | — | — | −36 | −21 | −21 | — |
| | A(λ)[nm] | — | — | — | — | 0 | 9 | 9 | — |
| | B(λ)[—] | — | — | — | — | 0 | 28 | 28 | — |
| | $A_{min}$[nm] | — | — | — | — | 0 | 0 | 0 | — |
| | $\lambda_{min}$[nm] | — | — | — | — | 650 | 650 | 650 | — |
| | $A(\lambda_{min})/A(\lambda_{max})$ | — | — | — | — | 0 | 0 | 0 | — |
| Total | Maximal absorption wavelength 1   Rth(λ)[nm] | −177 | −54 | −50 | −177 | −58 | −25 | −25 | −130 |
| | A(λ)[nm] | 104 | 46 | 114 | 104 | 38 | 30 | 30 | 160 |
| | B(λ)[—] | 37 | 40 | 148 | 37 | 44 | 71 | 71 | 70 |
| | Maximal absorption wavelength 2   Rth(λ)[nm] | — | — | — | — | −86 | −49 | −49 | — |
| | A(λ)[nm] | — | — | — | — | 114 | 74 | 74 | — |
| | B(λ)[—] | — | — | — | — | 148 | 133 | 133 | — |
| Display performance evaluation | | A | B | C | A | B | A | A+ | B |

TABLE 3

| | | Example 15 | Example 16 | Example 17 | Example 18 |
|---|---|---|---|---|---|
| Organic EL display device Configuration | | 15 | 16 | 17 | 18 |
| | | | P16 | P17 | P18 |
| | | | λ/4 plate | λ/4 plate | λ/4 plate |
| | | | Polarizer | Polarizer | Polarizer |
| | | P15 | λ/4 plate | λ/4 plate | λ/4 plate |
| | | OLED4 | OLED2 | OLED1 | OLED2 |
| Maximal absorption wavelength 1 [nm] | | 460 | 490 | 590 | 480 |
| Light absorption anisotropic layer | θ[°] | 0 | 0 | 0 | 0 |
| | Maximal absorption wavelength 1   Rth(λ)[nm] | −85 | −230 | −20 | −45 |
| | A(λ)[nm] | 60 | 210 | 60 | 70 |
| | B(λ)[—] | 40 | 30 | 25 | 15 |
| | $A_{min}$[nm] | 0 | 0 | 0 | 0 |
| | $\lambda_{min}$[nm] | 650 | 650 | 400 | 650 |
| | $A(\lambda_{min})/A(\lambda_{max})$ | 0 | 0 | 0 | 0 |
| Display performance evaluation | | B | D | D | D |

TABLE 4

| | | Comparative Example 1 | Comparative Example 2 | Comparative Example 3 | Comparative Example 4 | Comparative Example 5 | Comparative Example 6 |
|---|---|---|---|---|---|---|---|
| Organic EL display device Configuration | | B1 | B2 | B3 | B4 | B5 | B6 |
| | | | | | PB4 | PB5 | PB6 |
| | | λ/4 plate | λ/4 plate | λ/4 plate | λ/4 plate | λ/4 plate | λ/4 plate |
| | | Polarizer | Polarizer | Polarizer | Polarizer | Polarizer | Polarizer |
| | | λ/4 plate | λ/4 plate | λ/4 plate | λ/4 plate | λ/4 plate | λ/4 plate |
| | | OLED1 | OLED3 | OLED2 | OLED1 | OLED1 | OLED1 |
| Maximal absorption wavelength 1 [nm] | | — | — | — | 580 | 580 | 580 |
| Light absorption anisotropic layer | θ[°] | — | — | — | 0 | 0 | 0 |
| | Maximal   Rth(λ)[nm] | — | — | — | −5 | −115 | −225 |

TABLE 4-continued

| | | Comparative Example 1 | Comparative Example 2 | Comparative Example 3 | Comparative Example 4 | Comparative Example 5 | Comparative Example 6 |
|---|---|---|---|---|---|---|---|
| absorption | $A(\lambda)$[nm] | — | — | — | 10 | 260 | 230 |
| wavelength 1 | $B(\lambda)$[—] | — | — | — | 28 | 26 | 20 |
| | $A_{min}$[nm] | — | — | — | 1 | 13 | 10 |
| | $\lambda_{min}$[nm] | — | — | — | 400 | 400 | 400 |
| | $A(\lambda_{min})/A(\lambda_{max})$ | — | — | — | 0.1 | 0.05 | 0.04 |
| Display performance evaluation | | G | F | F | G | G | G |

From the results shown in Tables 1 to 4, it was confirmed that in the organic EL display device according to the embodiment of the present invention, which had a predetermined configuration and in which $A(\lambda)$ represented by Expression (1) was 15 to 225 nm at the maximal absorption wavelength of the light absorption anisotropic layer, the change in tint could be suppressed in a case where the white display was visually recognized from an oblique direction.

On the other hand, in the organic EL display device of Comparative Example, which was not having the light absorption anisotropic layer or in which the $A(\lambda)$ at a maximal absorption wavelength was not 15 to 225 nm, the change in tint could not be suppressed in a case where the white display was visually recognized from the oblique direction.

From the comparison between Example 2, and Examples 12 and 13, it was confirmed that, in a case where the polarizer was further provided, the polarization control layer was disposed on a visible side of the polarizer, the polarization control layer was a λ/4 film, and the phase difference Rth in the thickness direction of the light absorption anisotropic layer at the maximal absorption wavelength of the light absorption anisotropic layer was −200 to −20 nm, the change in tint could be further suppressed in a case where the white display was visually recognized from the oblique direction.

10: organic EL display device
12: organic EL display element
14: light absorption anisotropic layer

What is claimed is:
1. An organic EL display device comprising:
an organic EL display element; and
a light absorption anisotropic layer,
wherein the light absorption anisotropic layer is a light absorption anisotropic layer formed of a composition containing a liquid crystal compound and a dichroic substance,
an angle between a transmittance central axis of the light absorption anisotropic layer and a normal line of a layer plane of the light absorption anisotropic layer is 0° or more and 45° or less,
$A(\lambda)$ of the light absorption anisotropic layer represented by Expression (1) is 15 to 225 nm at a maximal absorption wavelength of the light absorption anisotropic layer, and
$B(\lambda)$ represented by Expression (2) is 30 or more at the maximal absorption wavelength of the light absorption anisotropic layer,

$$A(\lambda) = \{kz(\lambda) - (kx(\lambda) + ky(\lambda))/2\} \times d \qquad \text{Expression (1)}$$

in Expression (1), d is a thickness of the light absorption anisotropic layer, $kx(\lambda)$ and $ky(\lambda)$ are each an attenuation index with respect to light having a wavelength $\lambda$ in each of an x axis direction and a y axis direction orthogonal to each other in a plane of the light absorption anisotropic layer, and $kz(\lambda)$ is an attenuation index with respect to the light having the wavelength $\lambda$ in a z axis direction orthogonal to the plane including the x axis and the y axis,
provided that a unit of the thickness of the light absorption anisotropic layer represented by d is nm, $$B(\lambda) = kz(\lambda)/\{(kx(\lambda) + ky(\lambda))/2\} \qquad \text{Expression (2)}$$

in Expression (2), $kx(\lambda)$ and $ky(\lambda)$ are each the attenuation index with respect to the light having the wavelength $\lambda$ in each of the x axis direction and the y axis direction orthogonal to each other in the plane of the light absorption anisotropic layer, and $kz(\lambda)$ is the attenuation index with respect to the light having the wavelength $\lambda$ in the z axis direction orthogonal to the plane including the x axis and the y axis.

2. The organic EL display device according to claim 1, further comprising:
a polarizer,
wherein the light absorption anisotropic layer is disposed on a visible side of the polarizer.

3. The organic EL display device according to claim 2, further comprising:
a polarization control layer,
wherein the polarization control layer is disposed on the visible side of the polarizer.

4. The organic EL display device according to claim 3, wherein the polarization control layer is a depolarization film.

5. The organic EL display device according to claim 1, wherein the liquid crystal compound has a forward wavelength dispersion, and
the composition contains a vertical alignment agent.

6. The organic EL display device according to claim 1, wherein a ratio of a smallest value of $A(\lambda)$ of the light absorption anisotropic layer at a wavelength of 400 to 650 nm to a value of $A(\lambda)$ at the maximal absorption wavelength of the light absorption anisotropic layer is 0.35 or less.

7. The organic EL display device according to claim 1, wherein, in a white display, the organic EL display element has Δu'v'(60°) larger than 0.005, which is represented by Expression (3A), on a CIE 1976 u'v' chromaticity diagram, and
in at least one layer of the light absorption anisotropic layers, the angle between the transmittance central axis of the light absorption anisotropic layer and the normal line of the layer plane of the light absorption anisotropic layer is 15° or more and 45° or less, Expression (3A)

$$\Delta u' v'(60°) =$$

$$\sqrt{\{(u'(0°, 60°) - u'(180°, 60°))^2 + (v'(0°, 60°) - v'(180°, 60°))^2\}} + $$

$$\sqrt{\{(u'(90°, 60°) - u'(270°, 60°))^2 + (v'(90°, 60°) - v'(270°, 60°))^2\}}$$

in Expression (3A), u'(a°, b°) is a u' value at an azimuthal angle a° and a polar angle b° on the CIE 1976 u'v' chromaticity diagram, and v'(a°, b°) is a v' value at the azimuthal angle a° and the polar angle b° on the CIE 1976 u'v' chromaticity diagram, provided that, in a case where a display region of the organic EL display device is viewed from a vertical direction, the azimuthal angle refers to an angle that is increased counterclockwise in a case where azimuth from a downward direction toward a upward direction in a plane of the display region is 0°.

8. The organic EL display device according to claim 7, further comprising:

a polarizer; and a polarization control layer, wherein the polarization control layer, the light absorption anisotropic layer, and the polarizer are laminated in this order from a visible side.

9. The organic EL display device according to claim 1, wherein, in a white display, the organic the organic EL display element satisfies a relationship of u'(0°)>u'(30°) >u'(60°), and satisfies a relationship of v'(0°)>v'(30°) and v'(0°)>v'(60°), and the maximal absorption wavelength of the light absorption anisotropic layer is in a range of 460 to 500 nm, here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

10. The organic EL display device according to claim 1, wherein, in a white display, the organic the organic EL display element satisfies a relationship of u'(0°)>u'(30°) and u'(0°)>u'(60°), and satisfies a relationship of v'(0°) >v'(30°) and v'(30°)>v'(60°), and the maximal absorption wavelength of the light absorption anisotropic layer is in a range of 510 to 570 nm, here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

11. An organic EL display device comprising:

an organic EL display element;

a light absorption anisotropic layer;

a polarizer; and a polarization control layer, wherein the light absorption anisotropic layer is a light absorption anisotropic layer formed of a composition containing a liquid crystal compound and a dichroic substance, an angle between a transmittance central axis of the light absorption anisotropic layer and a normal line of a layer plane of the light absorption anisotropic layer is 0° or more and 45° or less, A(λ) of the light absorption anisotropic layer represented by Expression (1) is 15 to 225 nm at a maximal absorption wavelength of the light absorption anisotropic layer, the light absorption anisotropic layer is disposed on a visible side of the polarizer, the polarization control layer is disposed on the visible side of the polarizer, the polarization control layer is a λ/4 film, and a phase difference Rth in a thickness direction of the light absorption anisotropic layer is −200 to −20 nm at the maximal absorption wavelength of the light absorption anisotropic layer, $$A(\lambda) = \{kz(\lambda) - (kx(\lambda) + ky(\lambda))/2\} \times d \qquad \text{Expression (1)}$$

in Expression (1), d is a thickness of the light absorption anisotropic layer, kx(λ) and ky(λ) are each an attenuation index with respect to light having a wavelength λ in each of an x axis direction and a y axis direction orthogonal to each other in a plane of the light absorption anisotropic layer, and kz(λ) is an attenuation index with respect to the light having the wavelength λ in a z axis direction orthogonal to the plane including the x axis and the y axis, provided that a unit of the thickness of the light absorption anisotropic layer represented by d is nm.

12. The organic EL display device according to claim 11, wherein B(λ) represented by Expression (2) is 30 or more at the maximal absorption wavelength of the light absorption anisotropic layer, $$B(\lambda) = kz(\lambda)/\{(kx(\lambda) + ky(\lambda))/2\} \qquad \text{Expression (2)}$$

in Expression (2), kx(λ) and ky(λ) are each the attenuation index with respect to the light having the wavelength λ in each of the x axis direction and the y axis direction orthogonal to each other in the plane of the light absorption anisotropic layer, and kz(λ) is the attenuation index with respect to the light having the wavelength λ in the z axis direction orthogonal to the plane including the x axis and the y axis.

13. The organic EL display device according to claim 11, wherein the liquid crystal compound has a forward wavelength dispersion, and the composition contains a vertical alignment agent.

14. The organic EL display device according to claim 11, wherein a ratio of a smallest value of A(λ) of the light absorption anisotropic layer at a wavelength of 400 to 650 nm to a value of A(λ) at the maximal absorption wavelength of the light absorption anisotropic layer is 0.35 or less.

15. The organic EL display device according to claim 11, wherein, in a white display, the organic EL display element has Δu'v'(60°) larger than 0.005, which is represented by Expression (3A), on a CIE 1976 u'v' chromaticity diagram, and in at least one layer of the light absorption anisotropic layers, the angle between the transmittance central axis of the light absorption anisotropic layer and the normal line of the layer plane of the light absorption anisotropic layer is 15° or more and 45° or less, Expression (3A)

$$\Delta u'v'(60°) =$$

$$\sqrt{\{(u'(0°, 60°) - u'(180°, 60°))^2 + (v'(0°, 60°) - v'(180°, 60°))^2\}} +$$

$$\sqrt{\{(u'(90°, 60°) - u'(270°, 60°))^2 + (v'(90°, 60°) - v'(270°, 60°))^2\}}$$

in Expression (3A), u'(a°, b°) is a u' value at an azimuthal angle a° and a polar angle b° on the CIE 1976 u'v' chromaticity diagram, and v'(a°, b°) is a v' value at the azimuthal angle a° and the polar angle b° on the CIE 1976 u'v' chromaticity diagram, provided that, in a case where a display region of the organic EL display device is viewed from a vertical direction, the azimuthal angle refers to an angle that is increased counterclockwise in a case where azimuth from a downward direction toward a upward direction in a plane of the display region is 0°.

16. The organic EL display device according to claim 15, further comprising:

a polarizer; and a polarization control layer, wherein the polarization control layer, the light absorption anisotropic layer, and the polarizer are laminated in this order from a visible side.

17. The organic EL display device according to claim 11, wherein, in a white display, the organic the organic EL display element satisfies a relationship of u'(0°)>u'(30°) >u'(60°), and satisfies a relationship of v'(0°)>v'(30°) and v'(0°)>v'(60°), and the maximal absorption wavelength of the light absorption anisotropic layer is in a range of 460 to 500 nm, here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

18. The organic EL display device according to claim 11, wherein, in a white display, the organic the organic EL display element satisfies a relationship of u'(0°)>u'(30°) and u'(0°)>u'(60°), and satisfies a relationship of v'(0°) >v'(30°) and v'(30°)<v'(60°), and the maximal absorption wavelength of the light absorption anisotropic layer is in a range of 510 to 570 nm, here, u'(c°) is an average value of u' values at all azimuthal angles and a polar angle c° on a CIE 1976 u'v' chromaticity diagram, and v'(c°) is an average value of v' values at all azimuthal angles and the polar angle c° on the CIE 1976 u'v' chromaticity diagram.

* * * * *